(12) United States Patent
Markov et al.

(10) Patent No.: US 8,141,024 B2
(45) Date of Patent: Mar. 20, 2012

(54) TEMPORALLY-ASSISTED RESOURCE SHARING IN ELECTRONIC SYSTEMS

(75) Inventors: Igor L. Markov, Ann Arbor, MI (US); Kenneth S. McElvain, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 798 days.

(21) Appl. No.: 12/204,786

(22) Filed: Sep. 4, 2008

(65) Prior Publication Data

US 2010/0058261 A1 Mar. 4, 2010

(51) Int. Cl.
*G06F 17/50* (2006.01)

(52) U.S. Cl. ........................................................ 716/132

(58) Field of Classification Search .................. 716/132, 716/135
See application file for complete search history.

(56) References Cited

U.S. PATENT DOCUMENTS

| | | | |
|---|---|---|---|
| 4,495,619 A | 1/1985 | Acampora | |
| 5,596,576 A | 1/1997 | Milito | |
| 5,737,237 A | 4/1998 | Tanaka et al. | |
| 6,112,016 A | 8/2000 | MacWilliams et al. | |
| 6,148,433 A | 11/2000 | Chowdhary et al. | |
| 6,285,211 B1 | 9/2001 | Sample et al. | |
| 6,401,176 B1 | 6/2002 | Fadavi-Ardekani et al. | |
| 6,438,730 B1 | 8/2002 | Atmakuri et al. | |
| 6,557,159 B1 | 4/2003 | Kutzschebauch et al. | |
| 6,560,761 B1 | 5/2003 | Yu et al. | |
| 6,735,712 B1 | 5/2004 | Maiyuran et al. | |
| 6,779,158 B2 | 8/2004 | Whitaker et al. | |
| 7,047,344 B2 | 5/2006 | Lou et al. | |
| 7,093,204 B2 | 8/2006 | Oktem et al. | |
| 7,305,586 B2 * | 12/2007 | Doing et al. | ..................... 714/28 |
| 7,337,418 B2 | 2/2008 | Kale et al. | |
| 2005/0229142 A1 | 10/2005 | Boppana et al. | |
| 2006/0149927 A1 | 7/2006 | Dagan et al. | |
| 2006/0265685 A1 | 11/2006 | Oktem et al. | |
| 2007/0005942 A1 | 1/2007 | Vinitzky et al. | |
| 2007/0126465 A1 | 6/2007 | Cox et al. | |
| 2007/0174794 A1 | 7/2007 | Oktem et al. | |
| 2008/0115100 A1 | 5/2008 | Vinitzky et al. | |
| 2010/0058298 A1 | 3/2010 | Markov et al. | |

FOREIGN PATENT DOCUMENTS

WO  WO 2006/092792 A2  9/2006

OTHER PUBLICATIONS

Jason Cong et al., "Pattern-Based Behavior Synthesis for FPGA Resource Reduction", FPGA '08, Monterey, California, Copyright 2008, ACM, Feb. 24-26, 2008, pp. 10 total.

Peter Tummeltshammer et al., "Time-Multiplexed Multiple-Constant Multiplication", IEEE Transactions on Computer-Aided Design of Integrated Circuits and Systems, vol. 26, No. 9, Sep. 2007, pp. 1551-1563.

(Continued)

*Primary Examiner* — Vuthe Siek

(74) *Attorney, Agent, or Firm* — Blakely, Sokoloff, Taylor & Zafman LLP; Judith A. Szepesi

(57) ABSTRACT

Methods and apparatuses to optimize integrated circuits by identifying functional modules in the circuit having similar functionality that can share circuit resources and producing a modified description of the circuit where the similar functional modules are folded onto common circuit resources and time-multiplexed using an original system clock or a fast clock.

64 Claims, 30 Drawing Sheets

OTHER PUBLICATIONS

Laura Pozzi et al., "Exact and Approximate Algorithms for the Extension of Embedded Processor Instruction Sets", IEEE Transactions on Computer-Aided Design of Integrated Circuits and Systems, vol. 25, No. 7, Jul. 2006, pp. 1209-1229.
Xiaoyong Chen et al., "Fast Identification of Custom Instructions for Extensible Processors", IEEE Transactions on Computer-Aided Design of Integrated Circuits and Systems, vol. 26, No. 2, Feb. 2007, pp. 359-368.
Anand Raghunathan et al., "SCALP: An Iterative-Improvement-Based Low-Power Data Path Synthesis System", IEEE Transactions on Computer-Aided Design of Integrated Circuits and Systems, vol. 16, No. 11, Nov. 1997, pp. 1260-1277.
M. Ciesielski et al., "Data-Flow Transformations using Taylor Expansion Diagrams", 2007 EDAA Design, Automation & amp; Test in Europe Conference & amp; Exhibition, 2007, pp. 6 total.
Y. Markovskiy et al., "C-slow Retiming of a Microprocessor Core" CS252 U.C. Berkeley Semester Project, date prior to the filing of this application, pp. 37 total.
Nicholas Weaver et al., "Post-Placement C-slow Retiming for the Xilinx Virtex FPGA", FPGA '03, Feb. 23-25, 2003 Monterey California, pp. 10 total.
Nicholas Weaver et al., "Post Placement C-Slow Retiming for Xilinx Virtex FPGAs", U.C. Berkeley Reconfigurable Architectures, Systems, and Software (BRASS) Group, ACM Symposium on Field Programmable Gate Arrays (GPGA) Feb. 2003, http://www.cs.berkeley.edu/~nweaver/cslow.html, pp. 1-24.
http://www.mplicity.com/technology.html, "Technology-CoreUpGrade Overview", date prior to the filing of this application, pp. 1-2.
http://www.mplicity.com/technology02.html, "Technology-CoreUpGrade Tools", date prior to the filing of this application, pp. 1-2.
http://www.mplicity.com/technology03.html, "Technology-Cost Reduction", date prior to the filing of this application, pp. 1 total.
http://www.mplicity.com/technology04.html, "Technology-Performance Enhancement", date prior to the filing of this application, pp. 1 total.
http://www.mplicity.com/technology05.html, "Technology-CoreUpGrade for a Processor Core", date prior to the filing of this application, pp. 1-2.
http://www.mplicity.com/products01.html, "Products-The Hannibal Tool", date prior to the filing of this application, pp. 1-3.
http://www.mplicity.com/products02.html, "Products—Genghis-Khan Tool", date prior to the filing of the application, pp. 1-4.
Steve Trimberger et al., "A Time-Multiplexed FPGA", Copyright 1997, IEEE, 0-8186-8159-4/97, pp. 22-28.
Soha Hassoun et al., "Regularity Extraction Via Clan-Based Structural Circuit Decomposition", http://www.eecs.tufts.edu/~soha/research/papers/iccad99.pdf, 1999, pp. 5 total.
Srinivasa R. Arikati et al., A Signature Based Approach to Regularity Extraction, Copyright 1997, IEEE, 1092-3152/97, pp. 542-545.
Wei Zhang et al., "Nature: A Hybrid Nanotube/CMOS Dynamically Reconfigurable Architecture", 41.1 DAC 2006, Jul. 24-28, 2006, San Francisco, California, Copyright 2006 ACM 1-59593-381-6/06/0007, pp. 711-716.
Steve Trimberger, "Scheduling Designs into a Time-Multiplexed FPGA", FPGA 98 Monterey, CA USA Copyright 1998, ACM 0-89791-978-5/98, pp. 153-160.
The International Search Report and The Written Opinion, PCT/US2009/051767, mailed Feb. 23, 2010, 12 pages.
The International Preliminary Report on Patentability, PCT/US2009/051767, mailed Mar. 17, 2011, 7 pages.
Parhi, Keshab K, "VLSI digital signal processing systems: design and implementation", Wiley-Interscience, 1999.
Thorton, J. E., "Parallel Operations in the Control Data 6600", AFIPS Proceedings FJCC, Part 2, vol. 26, 1964, pp. 33-40.
DeHon, A., et al. "Packet-Switched vs. Time-Multiplexed FPGA Overlay Networks," presented at FCCM 2006.

* cited by examiner

Before Sharing

After Sharing

Loop construct:

set j = 0
for j = 0 : 4
  data(j) <= j;
  j = j + 1;
end loop

Unrolled Loop:

j = 0
data(0) <= 0;
j = 0 + 1;
data (1) <= 1;
j = 1 + 1;
data (2) <= 2;
j = 2 + 1;
data (3) <= 3;
j = 3 + 1;
data (4) <= 4;
j = 4 + 1;
end

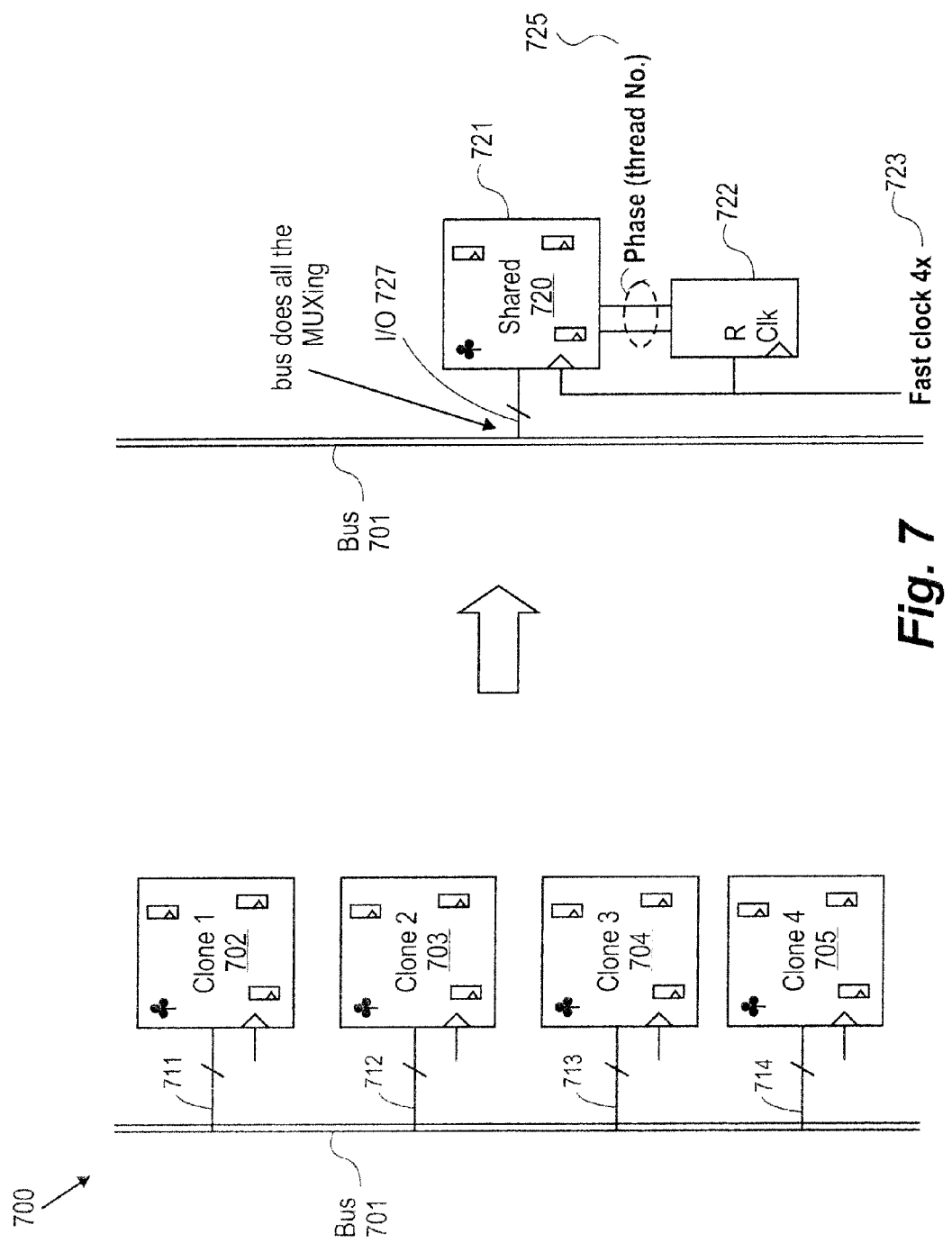

| RAMs 801 and 802 Address bits | | | |
|---|---|---|---|
| bit 3 | bit 2 | bit 1 | bit 0 |
| Unused | 0 | 0 | 0 |
| Unused | 0 | 0 | 1 |
| Unused | 0 | 1 | 0 |
| Unused | 0 | 1 | 1 |
| Unused | 1 | 0 | 0 |
| Unused | 1 | 0 | 1 |
| Unused | 1 | 1 | 0 |
| Unused | 1 | 1 | 1 |

| RAM 803 Address Bits | | | |
|---|---|---|---|
| bit 3 | bit 2 | bit 1 | bit 0 |
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |

*Fig. 8B*

| | | | |
|---|---|---|---|
| 0 | 4 | 8 | 12 |
| 1 | 5 | 9 | 13 |
| 2 | 6 | 10 | 14 |
| 3 | 7 | 11 | 15 |

Accessible Memory Locations 4-bit Address:
```
0 0 0 0 0 0 0 0 1 1 1 1 1 1 1 1
0 0 0 0 1 1 1 1 0 0 0 0 1 1 1 1
0 0 1 1 0 0 1 1 0 0 1 1 0 0 1 1
0 1 0 1 0 1 0 1 0 1 0 1 0 1 0 1
```

| | | |
|---|---|---|
| 0 | 4 | |
| 1 | 5 | |
| 2 | 6 | |
| 3 | 7 | |

Accessible Memory Locations 3-bit Address:
```
0 0 0 0 1 1 1 1
0 0 1 1 0 0 1 1
0 1 0 1 0 1 0 1
```

*Fig. 8C*

TEMPORALLY-ASSISTED RESOURCE SHARING IN ELECTRONIC SYSTEMS

FIELD OF THE INVENTION

The invention relates generally to electronic systems, and more particularly to optimizing electronic circuits through resource sharing.

BACKGROUND OF THE INVENTION

Electronic systems commonly contain duplicative circuitry for any number of reasons. Duplicative circuitry may be designed into an electronic system to achieve parallelism and additional throughput of data. For example, a packet router employs hundreds of identical channels to achieve the required throughput. Also, applications in multimedia, telecommunications, Digital Signal Processing (DSP), and microprocessors design naturally call for multiple copies of key circuit resources. On the other hand, in large circuit designs, flat duplication of circuit resources is often unintended and not considered carefully, leaving room for improvement.

Resource sharing is one way used to optimize electronic circuits through sharing and reuse of duplicative circuitry. Resource sharing enables electronic systems to be designed and manufactured cheaper and more efficiently by sharing the duplicative circuitry among several processes or users. In order to optimize a design using resource sharing, the duplicative circuitry must first be identified and then shared whenever possible. FIG. 1A illustrates resource sharing among modules with identical circuitry and common input/output (I/O) signals according to the prior art. FIG. 1A includes two identical circuits and/or functional modules, clone A 101 and clone B 102, having the same I/O signals, $IN_0$ and $OUT_0$, respectively. Since clone A 101 and clone B 102 contain duplicative circuitry and the same I/O, clone A 101 and clone B 102 are identified as candidates for sharing. Clone A 101 and clone B 102 each include duplicative circuitry that may be shared by both clone A 101 and clone B 102. This sharing of resources among duplicative circuits clone A 101 and clone B 102 is achieved by replacing clone A 101 and clone B 102 with a single shared resource 103 and appropriately routing the common I/O. The functionality of both clone A 101 and clone B 102 is maintained, but the resources required by the circuit are reduced through resource sharing. Sharing of resources can result in an overall size reduction in electronic circuitry. As a result, resource sharing has become a popular topic, and different methods of optimizing electronic systems using resource sharing have been explored.

In designing electronic circuits, transformations are frequently performed to optimize certain design goals. Transformations may be used to perform resource sharing and thereby reduce the area used by a circuit. A "folding transformation" is one of the systematic approaches to reduce the silicon area used by an integrated circuit. Such algorithmic operations can be applied to a single functional unit to reduce its resource requirements and also to multiple functional units to reduce their number. FIG. 1B illustrates resource sharing using a 2× folding transformation among candidates for sharing with same or similar functionality and/or circuitry and including different I/O signals according to the prior art. Before sharing, the two candidates clone A 101 and clone B 102 each have separate clock inputs connected to the same clock source, Ck, and different I/O (i.e., $IN_0$ and $OUT_0$ corresponding to clone A 101 and $IN_1$ and $OUT_1$ corresponding to clone B 102). Since clone A 101 and clone B 102 each contain same or similar circuitry and/or functionality, the resources utilized by each of clone A 101 and clone B 102 may be shared. A folding transformation may be performed to share resources including folding clone A 101 and clone B 102 onto a single set of common hardware resources, such as shared resource 103, and adding multiplexing circuitry to select between the I/O corresponding to clone A 101 and clone B 102, respectively. While in this example the two candidates belong to the same clock domain, resource sharing is also possible among candidates in different clock domains, e.g., in cases when only one of the candidates is going to be used at any given time.

In at least certain embodiments, the multiplexing circuitry includes multiplexing and demultiplexing circuits (such as MUX 105 and DeMUX 106 shown in FIG. 1B), and selection circuitry (such as selection circuit 109). The multiplexing circuitry is connected to the shared resources 103 in the configuration illustrated in FIG. 1B to alternatively select between the I/O of clone A 101 and the I/O of clone B 102. When the selection circuit 109 outputs a first selection value (say binary 0), this value is placed on line 131 causing the selection input 133 of MUX 105 to select input $IN_0$ corresponding to clone A 101 to pass through MUX 105 and into the input of shared resource 103. Likewise, this value (binary 0) placed on line 131 is also received at selection input 135 of DeMUX 106 causing outputs of shared resource 103 to pass through DeMUX 106 and through the output Out 0 of DeMUX 106 corresponding to clone A 101.

Alternatively, when the selection circuitry 109 outputs a second selection value (say binary 1) onto line 131, this value causes the selection input 133 of MUX 105 to select input $IN_1$ corresponding to clone B 102 to pass through MUX 105 and into the input of shared resource 103. Likewise, this value (binary 1) placed on line 131 is also received at selection input 135 of DeMUX 106 causing outputs of shared resource 103 to pass through DeMUX 106 and be output at $OUT_1$ of DeMUX 106 corresponding to clone B 102. In this manner, the resources of clone A 101 and clone B 102 are shared even though clone A 101 and clone B 102 include different I/O signals. The functionality of both clone A 101 and clone B 102 is maintained using roughly a half of the original resources (minus multiplexor overhead).

U.S. Pat. No. 7,093,204 (hereinafter "the Oktem patent") entitled "Method and Apparatus for Automated Synthesis of Multi-Channel Circuits" describes methods and apparatuses to automatically generate a time-multiplexed design of a multi-channel circuit from a single-channel circuit using a folding transformation. In Oktem, a single-channel circuit is replicated N times resulting in a multi-channel circuit containing N separate channels. Each of the N channels then becomes a candidate for sharing with identical circuitry and different I/O signals. A folding transformation is then performed to share resources among the N channels of the multi-channel circuit. However, the Oktem patent alters the functionality of the received circuit, rather than optimizing the circuit without changing its functionality. A continuation in part of the '204 patent, U.S. Pub. No. 2007-0174794 A1, extends the Oktem patent to receive a design having a plurality of instances of a logical block and automatically transform the system to a second design having a shared time-multiplexed variant of the original block. Additionally, the Oktem patent does not teach discovering previously unknown similar or identical subsets of a circuit for the purpose of resource sharing. More details about folding transformations can be found in "VLSI digital signal processing systems: design and implementation", by Keshab K. Parhi, Wiley-Interscience, 1999. The Oktem patent contains a discussion of prior art, which we hereby include by reference.

Traditional resource sharing in integrated circuit design is further discussed in Atmakuri et al., U.S. Pat. No. 6,438,730. The Atmakuri patent determines whether two or more branches in an electronic circuit drive a common output in response to a common select signal. If so, a determination is made whether the decision construct includes a common arithmetic operation in the branches so that the design may be optimized. Resource sharing is also considered in high-level synthesis, along with scheduling, where it is common to share arithmetic operations used to perform multiple functions.

Additionally, many previous resource sharing solutions are limited to specific cases. For example, some previous solutions implement shared modules in a very different form compared to the original modules, e.g., hardware implementation of frequently occurring software-program fragments, or transformation of an initial netlist into a netlist that performs another function. U.S. Pat. No. 5,596,576 to Milito entitled "Systems and Methods for Sharing of Resources" addresses dynamically assigning resources to users and charging users at different rates. The concept of resource sharing in some patents refers to communication channels or wireless spectrum, e.g., U.S. Pat. No. 4,495,619 to Acampora entitled "Transmitter and Receivers Using Resource Sharing and Coding for Increased Capacity." Another category, represented by the U.S. Pat. No. 7,047,344 to Lou et al. entitled "Resource Sharing Apparatus" deals with sharing peripheral devices of personal computers, connected through a bus, e.g., printers, keyboards and mice.

U.S. Pat. No. 6,779,158 to Whitaker et al. (hereinafter "the Whitaker patent") entitled "Digital Logic Optimization Using Selection Operators" describes a transformation of an ASIC-style netlist that optimizes design objectives such as area by transistor and standard-cell level resource sharing, and through the use of standard cells enriched with selection, which is essentially multiplexing. Much consideration is given to the layout of these standard cells. However, the conventional wisdom in the field is that most significant sharing is observed before mapping to ASIC-style gates. While the Whitaker patent mentions possibly considering higher levels of abstraction where a module would include a plurality of cells, it does not offer solutions that can be applied before mapping to cells occurs. Additionally, given that FPGAs are not designed with ASIC-style cell libraries described in the Whitaker patent, the patent does not apply to FPGAs.

Time-multiplexed resource sharing has been used in the electronic circuitry. For example, Peripheral and Control Processors (PACPs) of the CDC 6600 computer, described by J. E. Thornton in "Parallel Operations in the Control Data 6600", AFIPS Proceedings FJCC, Part 2, Vol. 26, 1964, pp. 33 40, share execution hardware by gaining access to common resources in a round-robin fashion. Further, "Time-Multiplexed Multiple-Constant Multiplication" by Tummeltshammer, Hoe and Püschel, published in IEEE Trans. on CAD 26(9) September 2007, discusses resource time-sharing among single-constant multiplications to reduce circuit size in Digital Signal Processing (DSP) applications. However, its techniques are limited to multiple-constant multiplication.

U.S. Pat. No. 6,735,712 to Maiyuran et al. (hereinafter "the Maiyuran patent") entitled "Dynamically Configurable Clocking Scheme for Demand Based Resource Sharing with Multiple Clock Crossing Domains" describes resource-sharing between or among two or more modules driven at different clock frequencies. The Maiyuran patent is limited to using three clocks and discloses how one module can temporarily use a fraction of resources from the other module. The Maiyuran patent selectively applies a clock signal that has the frequency of the first or second clock. Such a dynamically configurable clocking scheme may be difficult to implement and may result in a limited applicability, whereas fixed-frequency clock signals are more practical.

U.S. Pat. No. 6,401,176 to Fadavi-Ardekani et al., entitled "Multiple Agent Use of a Multi-Ported Shared Memory" assumes an arbiter and a super-agent that uses the shared memory more frequently than other agents. The super-agent is offered priority access, limiting agents to "open windows." "Post-placement C-slow Retiming for the Xilinx Virtex FPGA," by N. Weaveret et al., presented at the FPGA Symposium 2003, describes a semi-manual FPGA flow that receives a circuit design and creates a multi-threaded version of this design, using the duplication of all flip-flops followed by retiming. However, this methodology alters the functionality of the design or logic block. An equivalent technology was commercialized by Mplicity, Inc, which announced the gate-level Hannibal tool and the RTL Genghis-Khan tool. The Hannibal tool transforms a single logic block into an enhanced Virtual-Multi-Logic-Block. Genghis automatically transforms a single logic block RTL into a Virtual-Multi-Logic-Block RTL, while Khan performs automatic gate level optimization. The process invocation switch can be set to 2×, 3× or 4×. Mplicity materials disclose applications to multi-core CPUs. The handling of clocks is disclosed for single clock domains. Mplicity materials also disclose several block-based techniques for verifying multi-threaded blocks created using their tools. However, the Mplicity materials do not disclose sharing blocks with different functionality or automatic selection of single or multiple blocks for multi-threading.

The publication, "Packet-Switched vs. Time-Multiplexed FPGA Overlay Networks," presented at FCCM 2006, A. DeHon et al., compares packet-switching networks and the virtualization (time-multiplexing) of FPGA interconnects for sparse computations in Butterfly Fat Trees. However, this work does not disclose clocking or using more than one clock domain.

SUMMARY OF THE DESCRIPTION

At least certain embodiments of the invention include methods and apparatuses for optimizing an integrated circuit including receiving a design of the integrated circuit, identifying two or more subsets of the design having same or similar functionality as candidates for sharing, and producing a modified description of the design by sharing resources among each of the candidates for sharing using a folding transformation including folding the candidates for sharing onto a set of resources common to each, and time-multiplexing between operations of each of the candidates for sharing.

Embodiments further include determining which of the candidates for sharing can be operated at a higher clock-frequency, and performing time-multiplexing of the candidates for sharing at the higher clock-frequency in alternating micro-cycles of a fast clock, where the fast clock is faster than one or multiple system clocks of the original circuit. Embodiments further include determining which of the candidates for sharing include temporally-disjoint functions, and performing time-multiplexing of the candidates for sharing with temporally-disjoint functions using the one or multiple system clocks of the original circuit.

Some embodiments include time-multiplexing between operations of each of the candidates for sharing by generating a multiplexing circuit to time-multiplex among inputs corresponding to each of the candidates for sharing, and generating a demultiplexing circuit to time-demultiplex outputs received from the shared subset of the design.

BRIEF DESCRIPTION OF THE DRAWINGS

A better understanding of at least certain embodiments of the invention can be obtained from the following detailed description in conjunction with the following drawings, in which:

FIG. 7 illustrates resource sharing among I/O clients connected to an I/O bus according to an exemplary embodiment of the invention.

FIG. 8B illustrates a side-by-side comparison of configurations of memory address bits.

FIG. 8C illustrates a side-by-side comparison of addressable memory locations using 3-bit and 4-bit addressing, respectively.

DETAILED DESCRIPTION

Figure 1A:
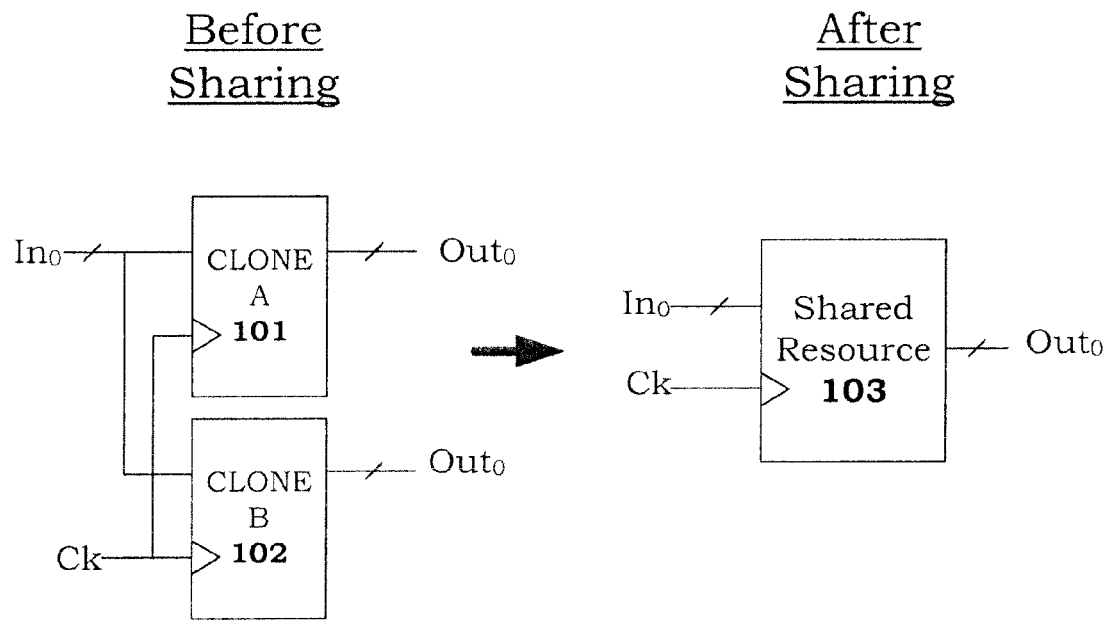
FIG. 1A illustrates resource sharing among modules with identical circuitry and common input/output (I/O) signals according to the prior art.
Figure 1B:
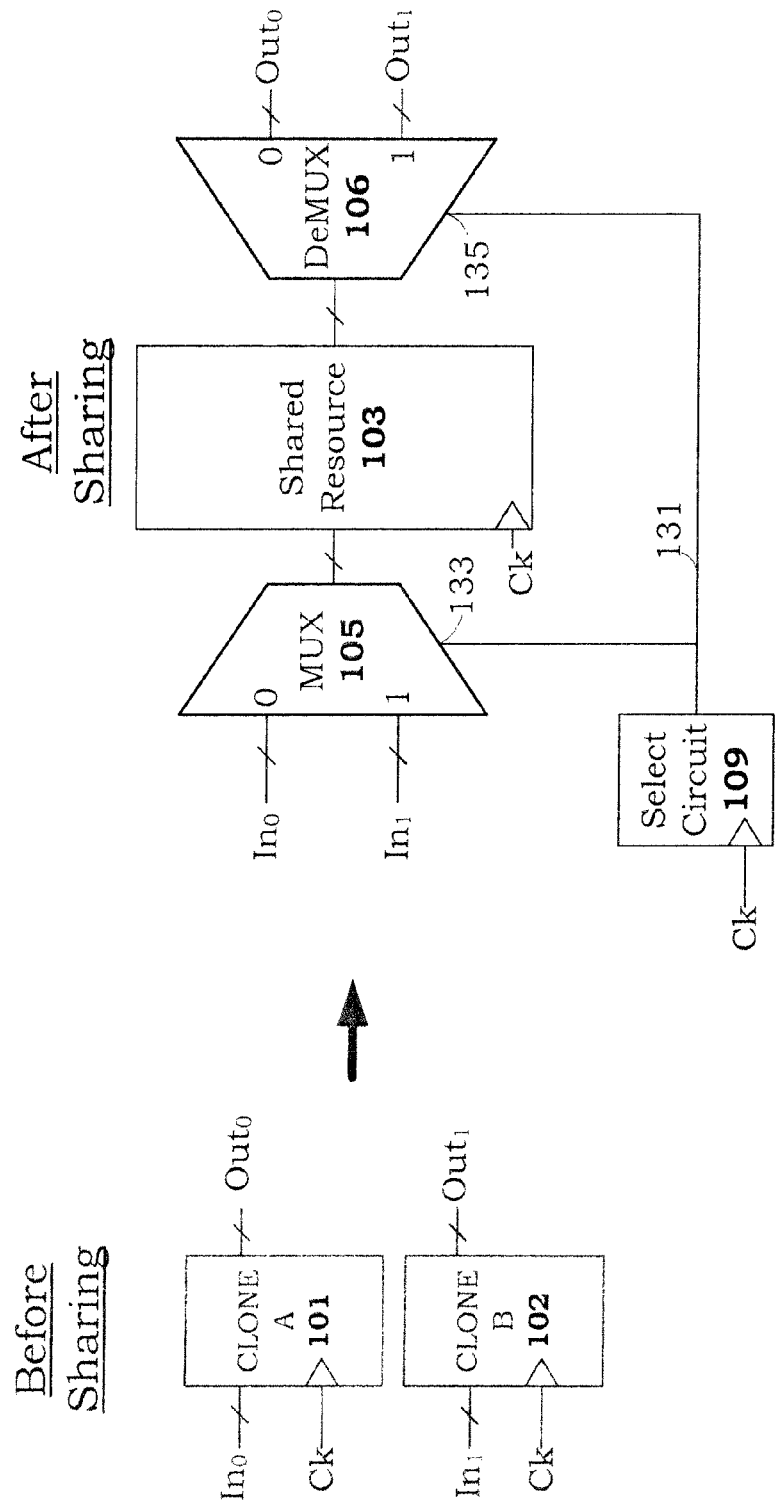
FIG. 1B illustrates resource sharing using a 2× folding transformation among candidates for sharing with same or similar functionality and/or circuitry and including different I/O signals according to the prior art.

Throughout the description, for the purposes of explanation, numerous specific details are set forth in order to provide a thorough understanding of the present invention. It will be apparent, however, to one skilled in the art that the present invention may be practiced without some of these specific details. In other instances, well known or conventional details are not described in order to avoid obscuring the description of the present invention.

I. N-Plexing Electronic Designs Using Time-Multiplexed Folding Transformation

At least certain embodiments enable optimization of electronic systems using resource sharing. Resource sharing makes electronic systems cheaper, as well as more space- and energy-efficient. Embodiments describe sharing using a folding transformation in conjunction with the same clock or a different clock, while the resulting electronic system is able to perform the exact same function as the original system under the exact same timing constraints, but do so with fewer resources.

Embodiments may be used to optimize electronic circuits implemented in one or more of Field-Programmable Gate Arrays (FPGAs), an Application-Specific Integrated Circuits (ASICs), microprocessors (CPUs), Digital Signal Processors (DSPs), Printed Circuit Boards (PCP), other circuit designs, and etc. Additionally, embodiments locate opportunities for sharing within a design of an electronic system and perform resource sharing on one or more located "candidates for sharing." These candidates for sharing may be described at one or more levels of specification including high-level descriptions such as chip-level or system-level, embedded system level, software subroutine level, mapped netlist level, Register Transfer Logic (RTL) level, Hardware Description Language (HDL) level, schematic level, technology-independent gate level, technology-dependent gate level, and/or circuit floorplan level, etc.

Moreover, the candidates for sharing may be of any type such as one or more of functional modules, subcircuits, blocks of data or code, software routines, parts of a body of a looping structure, subsets of data flow graph, and/or subsets of a control flow graph, and etc. In addition, the candidates for sharing may be identical to each other, or may differ to various extents including one or more of similar candidates for sharing, a collection of connected candidates for sharing, a collection of candidates for sharing not all of which are connected, candidates for sharing with logic around them, candidates for sharing similar to a subset of other candidates for sharing, and candidates for sharing replaceable by a specially-designed super-candidate for sharing. In the case where the candidates for sharing are not identical, control circuitry may be used to select out the functionality which differs between the candidates to allow the candidates to share their resources in common.

Embodiments of the invention describe novel mechanisms for identifying candidates for sharing resources in an electronic system, time-multiplexing them onto each other, optimizing performance, and verifying functional correctness. This process is defined herein as N-plexing. Additionally, a faster clock may help decrease existing resource duplication to lower area, cost, and/or power requirements, especially with on-chip support for multiple logical channels.

At least certain embodiments of the invention receive a description of an integrated circuit (a gate-level netlist, a RTL description, an HDL description, a high-level description, a description in the C language, etc.) and produce a modified description in the same or another form with the goal of improving one or more of cost, size, energy or power consumption characteristics. The first basic strategy is to identify candidates for sharing that are not used at the same time, such as communications and multimedia circuits for incompatible standards (GSM vs. CDMA, Quick Time vs. WINDOWS MEDIA vs. REAL VIDEO vs. DIVX, etc.) that may be implemented to share some physical resources (common DSP functions, MPEG-4 functions, etc.). The second basic strategy is to identify candidates for sharing that can be accelerated and/or operated at higher clock frequencies and shared by multiple functions (e.g., 7 identical channels of DOLBY 7.1 Home-Theater sound, picture-in-picture video streams, multiple TCP/IP links or Voice-Over-IP channels). Additionally, the invention anticipates strategies derived from the two basic strategies, such as functional decomposition. One example of a derivative strategy is decomposing a candidate for sharing (such as a multiplier or an FFT circuit) into several identical components, which can then be shared resulting in a smaller circuit with the same functionality. Another example is decomposing two candidates for sharing, to enable sharing of their respective components.

Figure 2A:
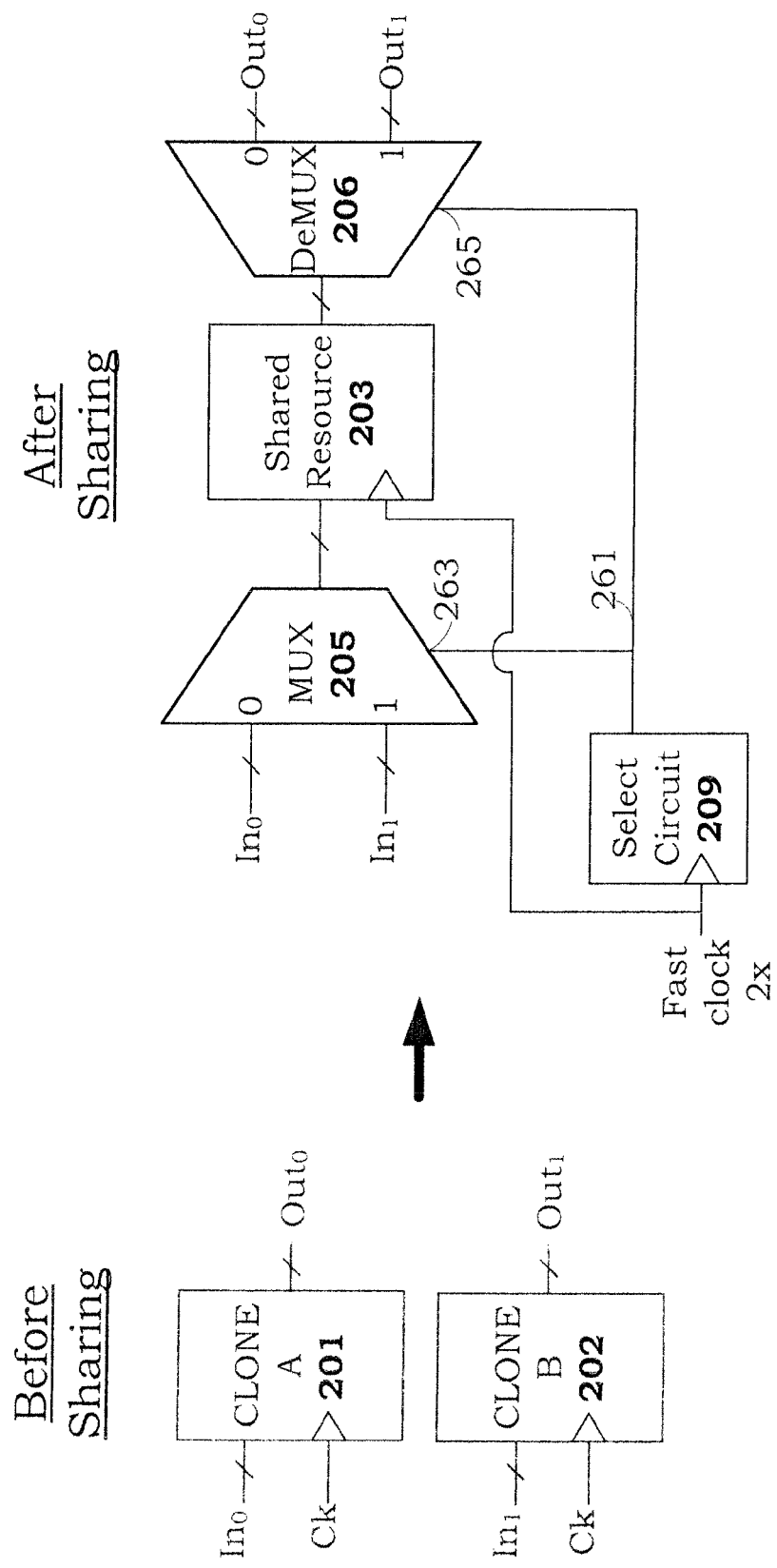
FIG. 2A illustrates resource sharing using a fast-clocked 2× folding transformation among candidates for sharing with same or similar functionality and/or circuitry and including different I/O signals according to an exemplary embodiment of the invention.

FIG. 2A illustrates resource sharing using a fast-clocked 2× folding transformation among candidates for sharing with same or similar functionality and/or circuitry and including different I/O signals according to an exemplary embodiment of the invention. For the purposes of this disclosure, cloned circuitry, such as clone A 201 and clone B 201 shown in FIG. 2A-FIG. 7, may be any subset of an electronic system design and/or description. Further, clone A 201 and clone B 202 refer to any candidates for sharing with the same or similar circuitry and/or functionality including candidates with identical circuitry and/or functionality, and/or candidates which differ in circuitry and/or functionality by varying degrees.

Before sharing, the two same or similar candidates for sharing clone A 201 and clone B 202 each have separate clock signals, Ck, and different I/O (i.e., $IN_0$ and $OUT_0$ corresponding to clone A 201, and $IN_1$ and $OUT_1$ corresponding to clone B 202), clone A 201 includes $IN_0$ and $OUT_0$, while clone B 202 includes $IN_1$ and $OUT_1$. For the purposes of this description $IN_0$ and $IN_1$ are assumed to be different inputs and $OUT_0$ and $OUT_1$ are assumed to be different outputs. Thus, clone A 201 includes different input/outputs than clone B 202. Since clone A 201 and clone B 202 contain same or similar circuitry, the resources utilized by each of clone A 201 and clone B 202 may be shared using a folding transformation. This folding transformation is performed by folding clone A 201 and clone B 202 onto a single set of common resources, shared resource 203, and connecting multiplexing circuitry to select between the I/O corresponding to clone A 201 and the I/O corresponding to clone B 202, respectively.

The multiplexing circuitry includes a multiplexing circuit and demultiplexing circuit (such as MUX 205 and DeMUX 206 shown in FIG. 2A), and selection circuitry (such as selection circuit 209). The multiplexing circuitry is connected around the shared resources 203 in the configuration illustrated in FIG. 2A to alternatively select between the I/O of clone A 201 and the I/O of clone B 202. The MUX 205 may be implemented as a regular multiplexor as is known and expected in the art, or as a parallel multiplexor or pMUX, which assumes one-hot encoded select signals. Of course, there are other possibilities, for example, one can multiplex an inverter onto a bypass (wire) by using an XOR gate (this takes care of both inputs and outputs). More generally, multiplexing/demultiplexing of functions $F1(x)$ and $F2(x)$ (here x is one or more input signals) can be performed by considering the function, $$G(\text{sel},x)=(\text{sel}?F1(x):F2(x)),$$

and using existing logic optimization tools to synthesize its implementation. Thus, there are various different implementations of "multiplexing" circuits. Additionally, it is possible to time-multiplex subsets of designs that do not have identical functionality, i.e., $F1(x)!=F2(x)$. Identifying groups of subsets that admit a compact multiplexed form is taught in the co-pending patent application filed herewith entitled "Approximate Functional Matching in Electronic Systems,", U.S. patent application Ser. No. 12,204,777, by inventors Igor L. Markov and Kenneth S. McElvain, which is incorporated herein by reference. This co-pending application also teaches how to construct supermodules, i.e., compact implementations of multiplexed forms.

When the selection circuit 209 outputs a first selection value (say binary 0), this value is placed on line 261 causing the selection input 263 of MUX 205 to select input $IN_0$ corresponding to clone A 201 to pass through MUX 205 and into the input of shared resource 203. Likewise, this value (binary 0) placed on line 261 is also received at selection input 265 of DeMUX 206 causing outputs of shared resource 203 to pass through DeMUX 206 and be output at $OUT_0$ of DeMUX 206 corresponding to clone A 201. Alternatively, when the selection circuitry 209 outputs a second selection value (say binary 1), this value is placed on line 261 causing the selection input 263 of MUX 205 to select input $IN_1$ corresponding to clone B 202 to pass through MUX 205 and into the input of shared resource 203. Likewise, this value (binary 1) placed on line 261 is also received at selection input 265 of DeMUX 206 causing outputs of shared resource 203 to pass through DeMUX 206 and be output at $OUT_1$ of DeMUX 206 corresponding to clone B 202. In this manner, the resources of clone A 201 and clone B 202 are shared even though clone A 201 includes different I/O signals than clone B 202. The functionality of both clone A 201 and clone B 202 is maintained using roughly a half of the original resources (i.e., minus multiplexing circuitry overhead).

The above is given by way of example and not of limitation as a demultiplexing circuit may be implemented in different ways as is known in the art. For example, DeMUX 206 can be a regular demultiplexor. Alternatively, DeMUX 206 may be implemented as a parallel demultiplexor or pDeMUX, which assumes one-hot encoded select signals. The demultiplexor is used to distribute time-multiplexed output signals from the shared resource to a set of receiving logic corresponding to output signals previously supplied by each of the same or similar design subsets sharing the circuit resources, wherein the demultiplexor includes select inputs to select between the receiving logic based on the assigned threads. However, the demultiplexor circuit 206 can be implemented as a set of output-enabled sequential circuits to distribute time-multiplexed output signals from the shared resources to a set of receiving logic corresponding to the output signals previously supplied by each of the same or similar design subsets sharing circuit resources. In this case, each of the set of output-enabled sequential circuits includes an enable input to select between the receiving logic based on the aforementioned assigned threads. Moreover, demultiplexor 206 may be implemented as a fan out circuit to distributed time-multiplexed output signals. In such a case, the receiving logic itself would have to be including enable signals to select between the receiving logic based on the assigned threads. Other such circuit configurations are contemplated to be within the scope of the invention.

In order to share resources for circuit elements such as clone A 201 and clone B 202 using folding transformation, the functionality must either be temporally-disjoint or capable of being accelerated to a higher clock frequency. Temporally-disjoint functionality means that the inputs and/or outputs are observable at different times. That is, the respective inputs and/or outputs will never be overlapping during the same cycle of the system clock. For example, temporally-disjoint functions may be placed in different clock cycles or may be separated by millions of clock cycles. Additionally, functionality that is not temporally-disjoint must be capable of operation at higher frequencies. Such functionality is known as "contemporaneously observable" or "temporally-overlapping" functionality. In the case of contemporaneously observable or temporally-overlapping functionality, such functions must be performed during the same clock cycle of the system clock. In order to accomplish this, in some cases the system clock may be accelerated to obtain a fast clock that is of the order of 2, 3, 4, or even 16 times faster than the original system clock. If the system clock can be accelerated by a factor of N times using the fast clock, then N times the functionality may be packed into a single cycle of the original system clock. This functionality may be performed during "micro-cycles" delimited by the cycles of the fast clock. For example, if the original system clock can be accelerated to a factor of 2×, then twice the functionality can be performed during the same period as the original system clock.

FIG. 2A describes the case where the candidates for sharing clone A 201 and clone B 202 include temporally-overlapping or contemporaneously observable functions and/or operations. That is, the candidates for sharing clone A 201 and clone B 202 include one or more overlapping inputs and/or outputs. This means that either some the inputs of both clone A 201 and clone B 202 are required at the same time, or some of the outputs of both clone A 201 and clone B 202 are required at the same time, or both. Before sharing, both clone A 201 and clone B 202 are clocked by the system clock denoted "Ck." After sharing, fast clock 2× is used to clock the selection circuit 209 and the Shared Resource 203. Fast clock 2×, in this case, is chosen to speed the system clock up by a factor of 2. Thus, fast clock 2× is twice as fast in clock frequency as the original system clock designated Ck that was previously used to clock clone A 201 and clone B 202.

As discussed above, selection circuit 209 is used to alternatively select between the I/O corresponding to clone A 201 and clone B 202, respectively. Now that fast clock 2× is applied to the selection circuit 209, the selection circuit toggles twice as fast. Thus, clocking the selection circuit 209 with fast clock 2× creates micro-cycles in which the selection circuit alternatively toggles between selecting the I/O corresponding to clone A 201 and clone B 202, respectively. Now, the functionality of both clone A 201 and clone B 202 may be completed on alternating micro-cycles delimited by cycles of fast clock 2×. As a result, the functionality of both clone A 201 and clone B 202 is completed during one clock period of the original system clock. That is, twice the functionality originally performed during one clock period of the original system clock, in at least certain embodiments, is now performed during the same one clock period using the fast clock. As a result, temporally-assisted resource sharing in electronic systems is realized using a folding transformation in conjunction with an accelerated clock.

Figure 2B:
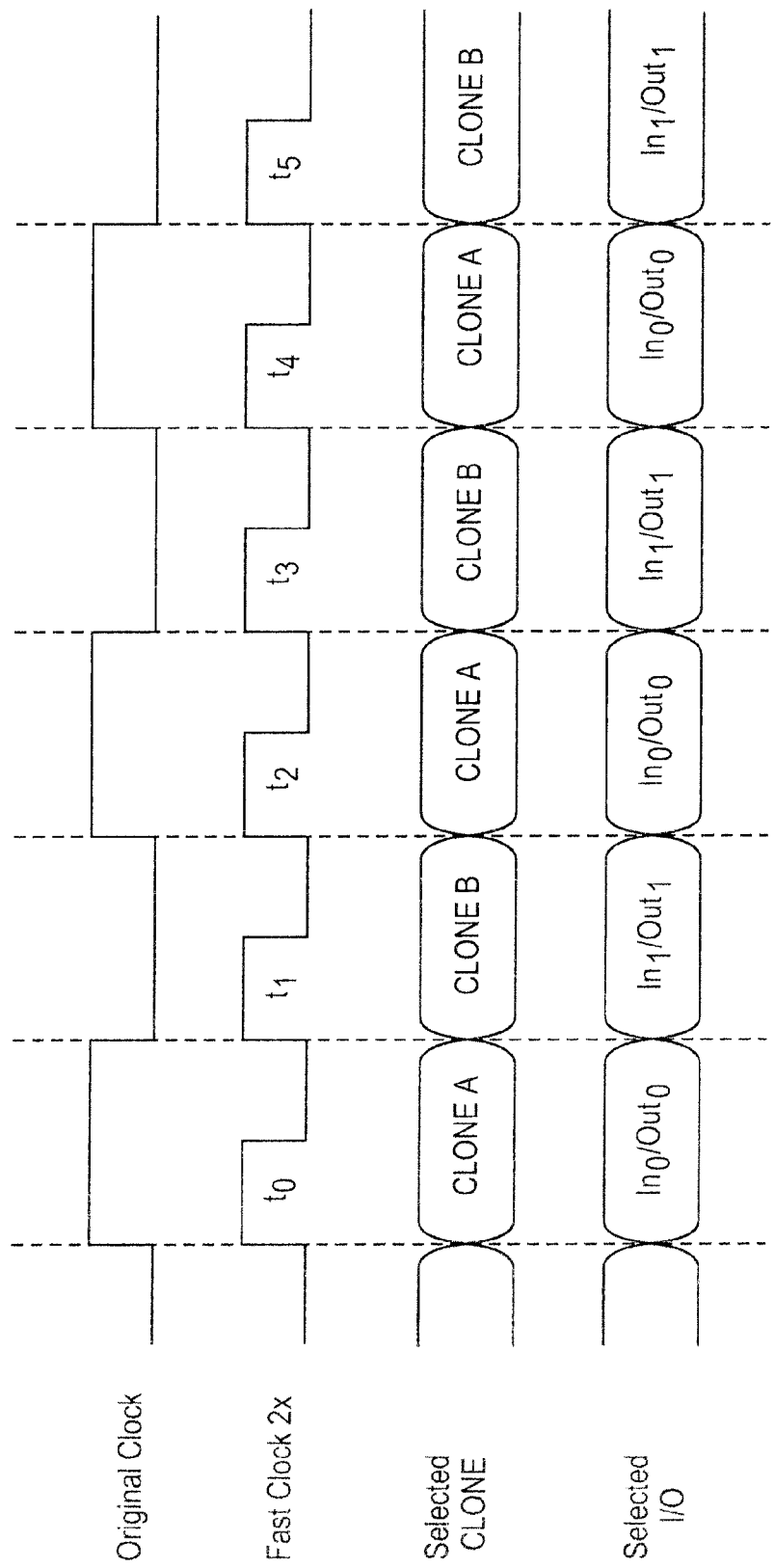
FIG. 2B illustrates a circuit timing diagram demonstrating time-multiplexing among the 2× folded candidates for sharing of FIG. 2A according to an exemplary embodiment of the invention.

Referring now to FIG. 2B, which illustrates a circuit timing diagram demonstrating time-multiplexing among the 2× folded candidates for sharing of FIG. 2A according to an exemplary embodiment of the invention. As can be seen from FIG. 2B, the original clock or system clock "Ck" cycles through values going from 0 to 1 and back to 0 again, whereas fast clock 2× makes two such transitions in the same period of time. That is, fast clock 2× is accelerated to twice the frequency of the original system clock. As discussed above, this fast clock 2× used to establish micro-cycles in which the functionality of each of the original circuits clone A 201, clone B 202, may be time-multiplexed across the shared resource 203. In FIG. 2B, at time t0 fast clock 2× transitions from low to high. In at least certain embodiments, this transition may correspond to a transition from 0 to 1 in binary. However, this is given by way of explanation and not limitation, as any clock transition is assumed to be within the scope of the present disclosure.

At time t0 fast clock 2× transitions from low to high, and therefore clocks selection circuit 209 causing selection circuit 209 to output a value (say binary 0) onto the line 261 and into selection input 263 of MUX 205. This value may further cause MUX 205 to select input $IN_0$ to pass through MUX 205 through to the output. This is not intended to limit the description as the transition from low to high of fast clock 2× can be configured to cause select circuit 209 to output a different value and select a different input of MUX 205. Such is a mere design choice. That is, in FIG. 2A selection circuit 209 may be configured so that during the first transition of fast clock 2× from low to high, the input $IN_0$ of MUX 205 is selected. However, selection circuit 209 may also be configured so that during the first transition of fast clock 2× from low to high, the input $IN_1$ of MUX 205 is selected.

Similarly, at time t0 fast clock 2× transitions from low to high, and therefore clocks selection circuit 209 causing selection circuit 209 to output a value (say binary 0) onto the line 261 and into selection input 265 of DeMUX 206. This value may further cause DeMUX 206 to select input $Out_0$ to pass to the output of DeMUX 206. Once again, this is not intended to limit the description as the transition from low to high of fast clock 2× can be configured to cause select circuit 209 to output a different value and select a different output of DeMUX 206. Such is a mere design choice. That is, in FIG. 2A selection circuit 209 may be configured so that during the first transition of fast clock 2× from low to high, the input $IN_0$ of MUX 205 is selected. However, selection circuit 209 may also be configured so that during the first transition of fast clock 2× from low to high, the output $OUT_1$ of DeMUX 206 is selected.

In both cases, however, the value placed onto line 261 and received at selection inputs 263 and 265 of MUX 205 and DeMUX 206, respectively, causes the alternating selection of the functionality corresponding to clone A 201 and/or clone B 202 to be selected during a given micro-cycle delimited by the cycles of fast clock 2×. In this way, the selection circuit 209 is operable to select the correct inputs and corresponding outputs to enable time-multiplexing between clone A 201 and clone B 202, which are now folded onto shared resource 203.

At time t1 fast clock 2× transitions from low to high, and therefore clocks selection circuit 209 causing selection circuit 209 to output a value (say binary 1) onto the line 261 and into selection input 263 of MUX 205. This value may further cause MUX 205 to select input $IN_1$ to pass through MUX 205 through to the output. This is not intended to limit the description as the transition from low to high of fast clock 2× can be configured to cause select circuit 209 to output a different value and select a different input of MUX 205. Such is a mere design choice. That is, in FIG. 2A selection circuit 209 may be configured so that during the second transition of fast clock 2× from low to high, the input $IN_1$ of MUX 205 is selected. However, selection circuit 209 may also be configured so that during the second transition of fast clock 2× from low to high, the input $IN_0$ of MUX 205 is selected.

Similarly, at time t1 fast clock 2× transitions from low to high, and therefore clocks selection circuit 209 causing selection circuit 209 to output a value (say binary 1) onto the line 261 and into selection input 265 of DeMUX 206. This value may further cause DeMUX 206 to select input $Out_1$ to pass to the output of DeMUX 206. Once again, this is not intended to limit the description as the transition from low to high of fast clock 2× can be configured to cause select circuit 209 to output a different value and select a different output of DeMUX 206.

In both cases, however, the value placed onto line 261 and received at selection inputs 263 and 265 of MUX 205 and DeMUX 206, respectively, causes the alternating selection of the functionality corresponding to clone A 201 and/or clone B 202 to be selected during a given micro-cycle delimited by the cycles of fast clock 2×. In this way, the selection circuit 209 is operable to select the correct inputs and corresponding outputs to enable time-multiplexing between clone A 201 and clone B 202, which are now folded onto shared resource 203.

Additionally, the operation of selection circuit 209 can be thought of as assigning one or more threads through the shared resource 203. The threads are assigned based on the number of candidates sharing resources. Inputs and their corresponding outputs are coordinated through time-multiplexing the signals through shared resource 203 using the assigned threads. Each of the assigned threads corresponds to a micro-cycle of the fast clock in which the time-multiplexing of each of the operations of the respective candidates for sharing is performed.

The configuration of FIG. 2A, therefore uses a folding transformation assisted by a fast clock to share resources among the candidates clone A 201 and clone B 202 in the same time period as that of the cycle delimited by the original system clock. In cases where the functionality of clone A 201 and clone B 202 is temporally-disjoint, the mutual functionality may be folded onto shared resource 203 and time-multiplexed using cycles of the original system clock; whereas, in cases where the functionality of clone A 201 and clone B 202 is temporally-overlapping and/or contemporaneously observable, the mutual functionality may be folded onto shared resource 203 and time-multiplexed using micro-cycles delimited by the fast clock.

This is illustrated in FIG. 2B, where during t0, the first transition of fast clock 2×, the functionality of clone A 201 is selected and the input $IN_0$ corresponding to clone A 201 is allowed to pass from the input of MUX 205 through to the input of shared resource 203. The output coming from the shared resource 203 is then passed to $OUT_0$, the output of DeMUX 206 corresponding to clone A 201. Similarly, during t1, the second transition of fast clock 2×, the functionality of clone B 202 is selected and the input $IN_1$ corresponding to clone B 202 is passed from the input of MUX 205 through to shared resource 203. The output coming from the shared resource 203 is then passed to $OUT_1$, the output of DeMUX 206 corresponding to clone B 202. This pattern repeats as infinitum.

Thus, using folding transformation assisted by time-multiplexing with a fast clock requires essentially one half the resources formerly needed by clone A 201 and clone B 202. Additionally, using time-assisted folding maintains the exact same circuit functionality that was originally available using both clone A 201 and clone B 202 separately. Performing this temporally-assisted resource sharing using a fast clock is advantageous in cases where the functionality and/or circuitry of candidates identified for sharing can be accelerated to a higher frequency because the resulting area savings can be anywhere from 10% to 90% depending on a number of factors including the semiconductor technology, circuit fabrics, use, and market-specific power-performance constraints. In the field of integrated circuits and other electronic subsystems the current trend is to pack more and more circuitry and/or functionality into smaller circuit profiles. As integrated circuits and other electronic systems and subsystems become more and more complex, the need to conserve area directly correlates with cost savings.

Furthermore, an important byproduct is the reduction of power dissipation due to leakage currents. Leakage currents are directly proportional to the number of transistors in a circuit design; and therefore, whenever the overall circuitry or other hardware resources is reduced, so is the power drain due to leakage currents. Moreover, since semiconductors are being made smaller and smaller over time, problems with leakage current power drain are becoming more pronounced and contribute to an increasing fraction of the total power in many new semiconductor manufacturing technologies.

Additionally, embodiments described herein allow for exact or partial matching of sharing opportunities. As discussed above, the candidates for sharing may include same or similar circuitry and/or functionality and be matched at any level of specification. The partial matching may be achieved using combinational logic synthesis to achieve efficient multiplexing of partial matches. This description contemplates locating candidates for sharing which may be any subset of an electronic design. Two similar candidates may each be restructured as a supermodule that contains the functionality of each. In at least certain embodiments of the supermodule case, control circuitry may be used to select out the functionality and/or other hardware resources that differs between the two similar design subsets. Embodiments, therefore, provide for sharing resources among any set of same or similar circuitry and/or functionality, which may be any subset of a circuit design. As a result, certain embodiments are capable of greater resource sharing in a broader variety of circumstances, and with smaller overhead, which results in greater savings in system cost, size, energy and power requirements, and possibly improved performance.

Of course, temporally-assisted resource sharing or N-plexing a design requires the ability to speed up the system clock in cases where the functions among the candidates for sharing are not temporally disjoint. In such cases, well known circuit optimization techniques may be used in conjunction with the principles of this description. Known design optimizations can be applied after N-plexing to improve performance, area, power or other parameters.

Figure 11A:
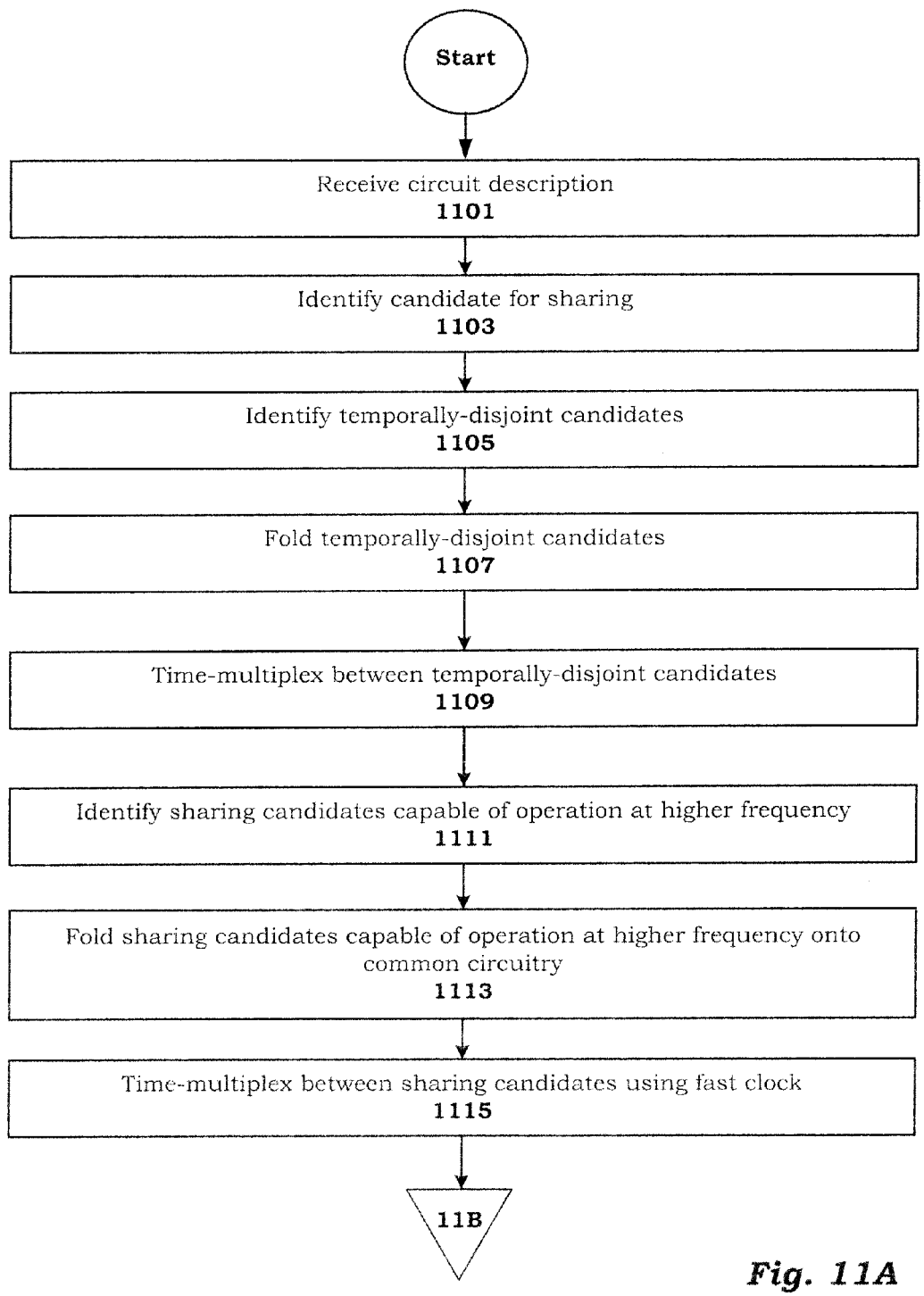
FIG. 11A illustrates a method of sharing resources through N-plexing according to an exemplary embodiment of the invention.

FIG. 11A illustrates a method of sharing resources through N-plexing according to an exemplary embodiment of the invention. Embodiments are provided to optimize electronic systems. In order to do so, a design or description of an electronic circuit or other electronic system is received (operation 1101). After reading the input description of an electronic system, at least certain embodiments identify opportunities for sharing. This can be done either automatically or by reading supplied hints, or by following specific instructions. As discussed previously, the electronic circuit may be implemented in any form and may be specified at any level. Candidates for sharing are identified based on same or similar circuitry and/or functionality (operation 1103). In at least certain embodiments, temporally-disjoint candidates are identified (operation 1105) and N-plexed including folding the temporally-disjoint candidates for sharing onto circuitry common to each (operation 1107) and then time-multiplexing between each of the temporally-disjoint candidates using the original system clock (operation 1109). Next, candidates for sharing capable of operation at higher frequencies are identified (operation 1111) and N-plexed including folding the candidates capable of operation at higher frequencies onto circuitry common to each (operation 1113) and then time-multiplexing between each of the candidates capable of operation at higher frequencies using the fast clock (operation 1115). For foldable resources (candidates for sharing) whose outputs are never used at the same time, embodiments may generate one or more enable signals which identify, for each clock cycle, the candidates whose outputs are used. For foldable resources and/or physical resources that can be operated at higher clock rates, embodiments identify multiple functions that can share such modules, by using them on alternating clock cycles of a faster clock. The invention can change or accelerate one or more of the system clocks, or it can enrich the system with one or more new clocks.

Figure 11B:
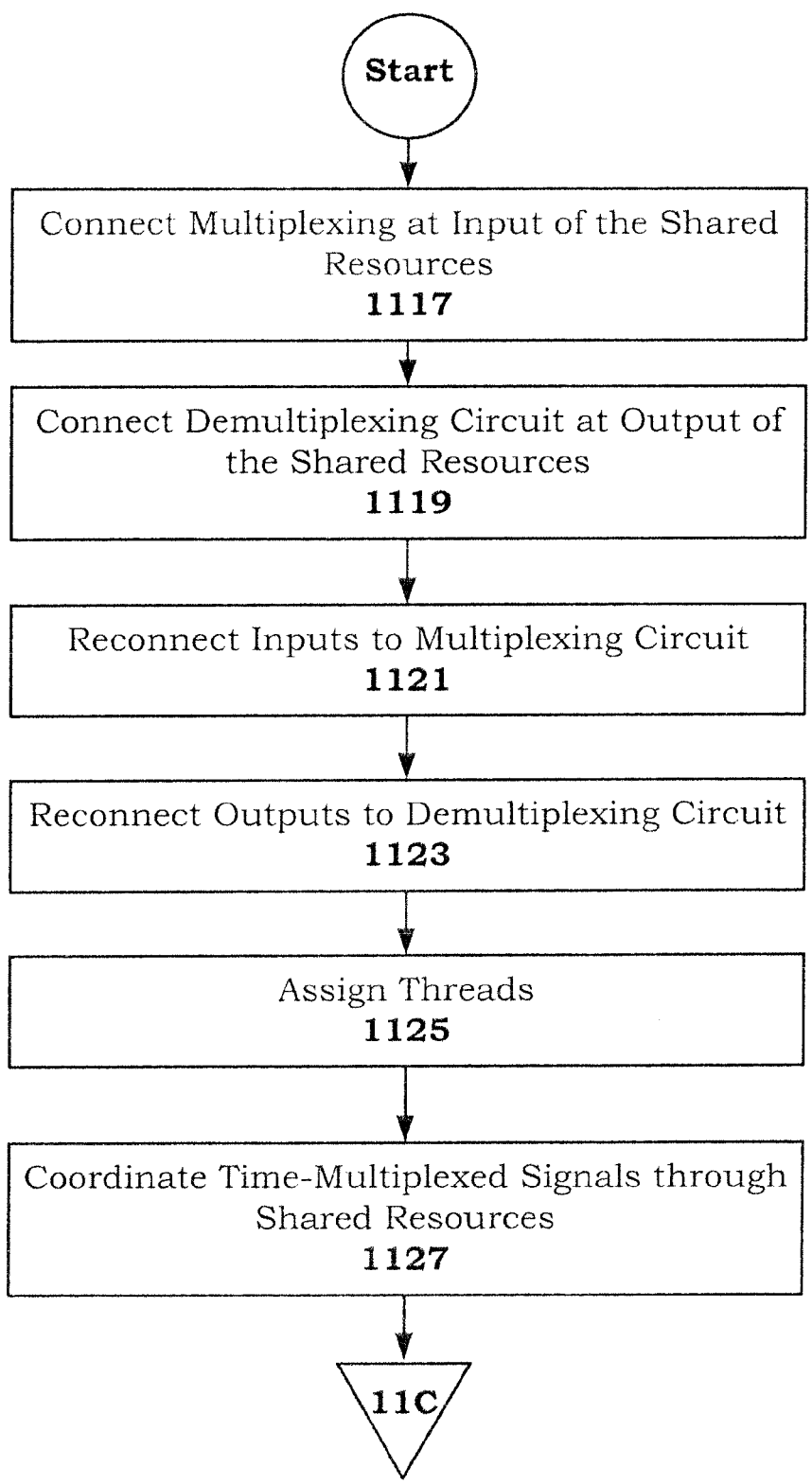
FIG. 11B illustrates further details of a method of sharing resources through N-plexing according to an exemplary embodiment of the invention.

In at least certain embodiments, inputs to the original foldable resources are re-connected to the shared resources, possibly through selection/multiplexor gates. FIG. 11B illustrates further details of a method of sharing resources through N-plexing according to an exemplary embodiment of the invention. In order to perform the time-multiplexing, in at least certain embodiments, multiplexing and demultiplexing circuitry must be added to select the appropriate threads and coordinate signals through the shared resources. In the illustrated embodiment, a multiplexing circuit (such as MUX 205 of FIG. 2A) is connected at the input of the shared resources, such as shared resource 203 of FIG. 2A (operation 1117). Then, a demultiplexing circuit (such as DeMUX 206 of FIG. 2A) is connected to the output of the shared resources (operation 1119). Inputs previously supplied to each of the N candidates for sharing are connected to the inputs of the multiplexing circuit (operation 1121). Outputs previously supplied from each of the N candidates for sharing are connected to the outputs of the demultiplexing circuit (operation 1123). Threads are then assigned (operation 1125) and the time-multiplexed signals through the shared resources are coordinated using a selection circuit to appropriately toggle inputs among the multiplexing and demultiplexing circuit (operation 1127).

II. Accounting for Sequential Logic

Figure 2C:
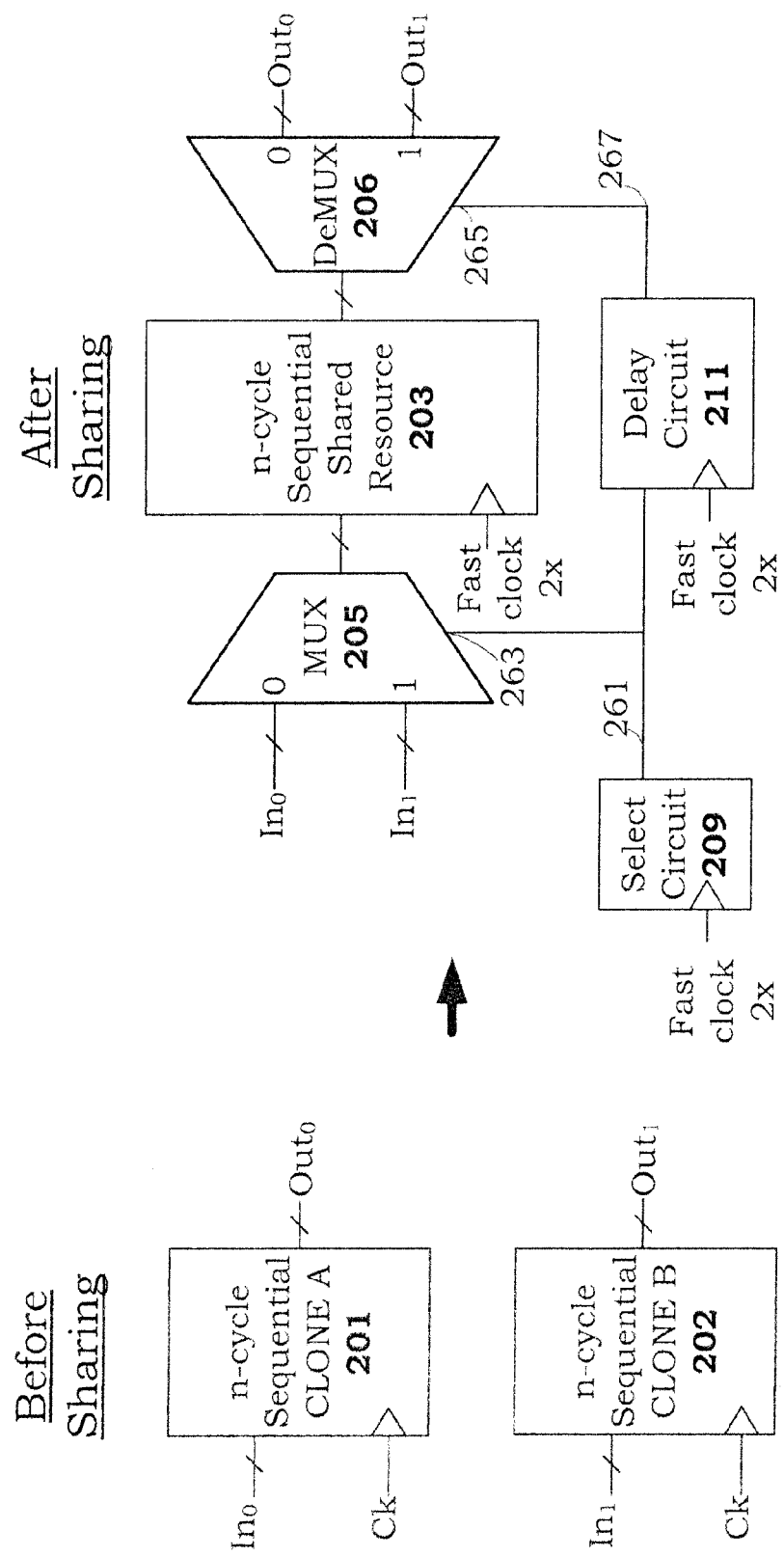
FIG. 2C illustrates resource sharing using a fast-clocked 2× folding transformation among candidates for sharing of FIG. 2A further including an x-cycle sequential logic delay according to an exemplary embodiment of the invention.

FIG. 2C illustrates resource sharing using a fast-clocked 2× folding transformation among candidates for sharing of FIG. 2A further including an x-cycle sequential logic delay according to an exemplary embodiment of the invention. In this case, clone A 201 and clone B 202 each include sequential logic of x stages. Sequential logic differs from purely combinational logic in that each stage of sequential logic requires a 1-cycle delay for signals passing through a circuit. Thus, sequential logic of x stages results in an x-cycle sequential delay across each of clone A 201 and clone B 202. Likewise, the shared resource 203 representing the hardware resources to be shared by clone A 201 and clone B 202 must also contain an x-cycle sequential delay. That is, inputs $IN_0$ and $IN_1$ going into x-cycle sequential clone A 201 and x-cycle sequential clone B 202, respectively, will be delayed x clock cycles of the original system clock before inputs $IN_0$ and $IN_1$ get to $OUT_0$ and $OUT_1$, respectively. Correspondingly, the delay across the shared resource 203 will be x cycles.

In order to account for the sequential delay in the x-cycle sequential candidates clone A 201 and clone B 202, an x-cycle delay must also be added to the select line 267 feeding the select input 265 of DeMUX 206. This x-cycle delay on line 267 will properly account for the x-cycle sequential delay across shared resource 203 such that the select signal placed on line 261 by select circuit 209 is received at the select input 265 of DeMUX 206 at the appropriate time. In the illustrated embodiment, this delay may be accounted for using a delay circuit. In FIG. 2C, this is accomplished using delay circuit 211. The delay circuit 211 is also clocked by fast clock 2×. Delay circuit 211 may be designed to delay the select signal using the following equation:

$$(x \bmod N) = \text{delay of select line } 267,$$

where x represents the sequential delay in clock cycles across the shared resource 203, and where N represents the number of candidates folded onto the shared resources.

Using this equation, the delay of the select line 267 can be properly set to match the delay across the shared resources 203. For example, if x=3 in the case where each of clone A 201, clone B 202 and shared resource 203 include a 3-cycle sequential delay, then the formula (3 MOD 2)=1, and a 1-cycle delay may be placed on line 261, thus delaying the selection signal 261 by 1 cycle before it gets to line 267 to feed select input 265 of DeMUX 206. However, this is given by way of illustration and not limitation, as any number of various circuit configurations may be used to properly delay select signal 267 and/or toggle input 265 of DeMUX 206 at the appropriate time. One such example is to simply switch the wires at select input 265 of DeMUX 206 in the fast clock 2× case.

During operation, selection circuit 209 will be clocked by fast clock 2×. On the first cycle of fast clock 2×, selection circuit 209 will output a value (say 0) on to line 261 causing the select input 263 to select one of the inputs of MUX 205 (say $IN_0$) to pass through MUX 205 and be output into shared resource 203. However, the value placed onto line 261 by selection circuit 209 will be delayed before it reaches the select input 265 of DeMUX 206. Specifically, the value on line 261 will be received at delay circuit 211 and be delayed appropriately. The combination of selection circuitry 209 and delay circuit 211 selects the correct thread passing through shared resource 203 at the correct time. In this way, inputs and their corresponding outputs are coordinated through time-multiplexing the signals through shared resource 203 based on the assigned threads. Each of the assigned threads will correspond to a micro-cycle of the fast clock in which the time-multiplexing of each of the operations of the respective candidates, clone A 201 or clone B 202, is performed.

Figure 2D:
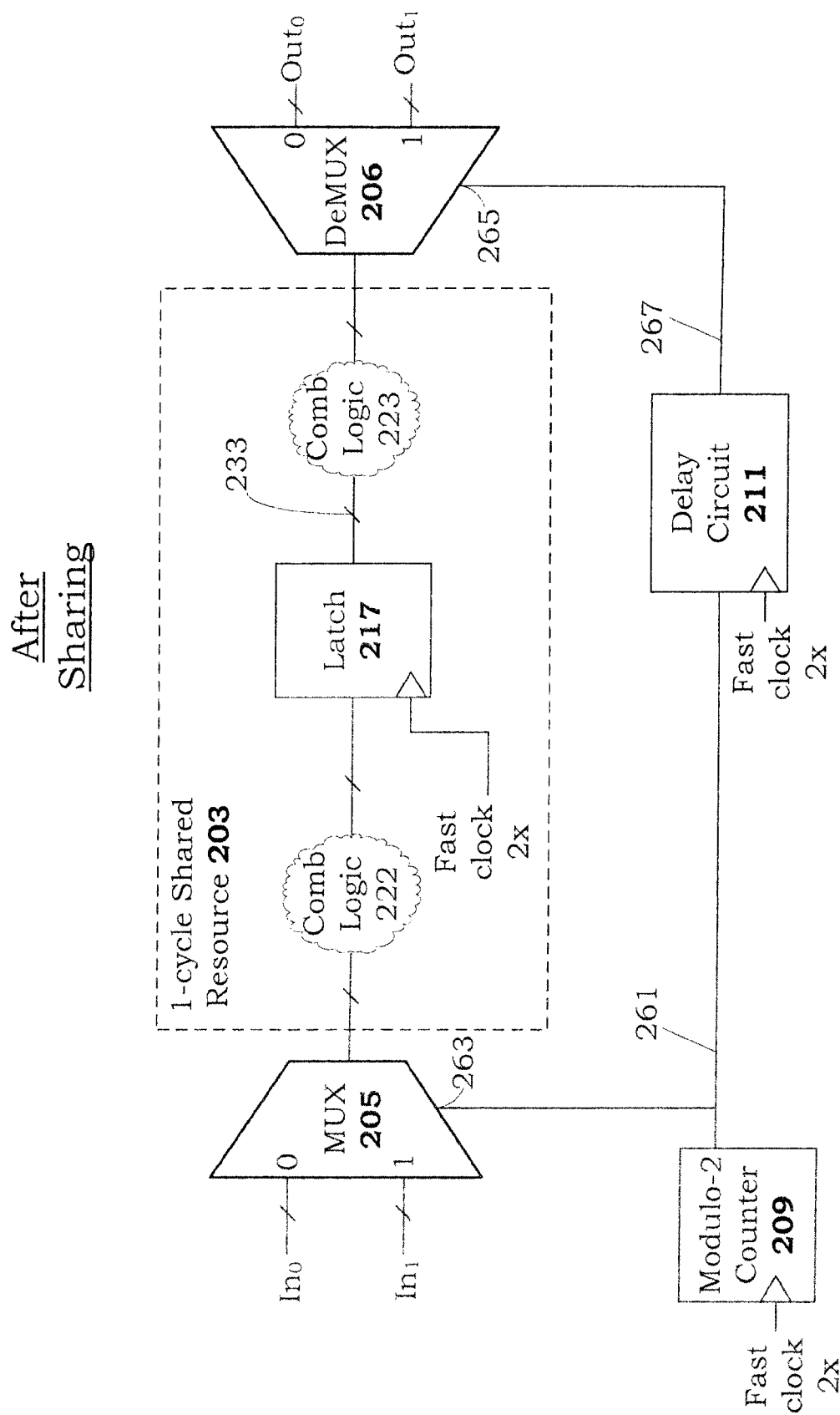
FIG. 2D illustrates resource sharing using a fast-clocked 2× folding transformation among candidates for sharing of FIG. 2A further including a 1-cycle sequential delay according to an exemplary embodiment of the invention.
Figure 2E:
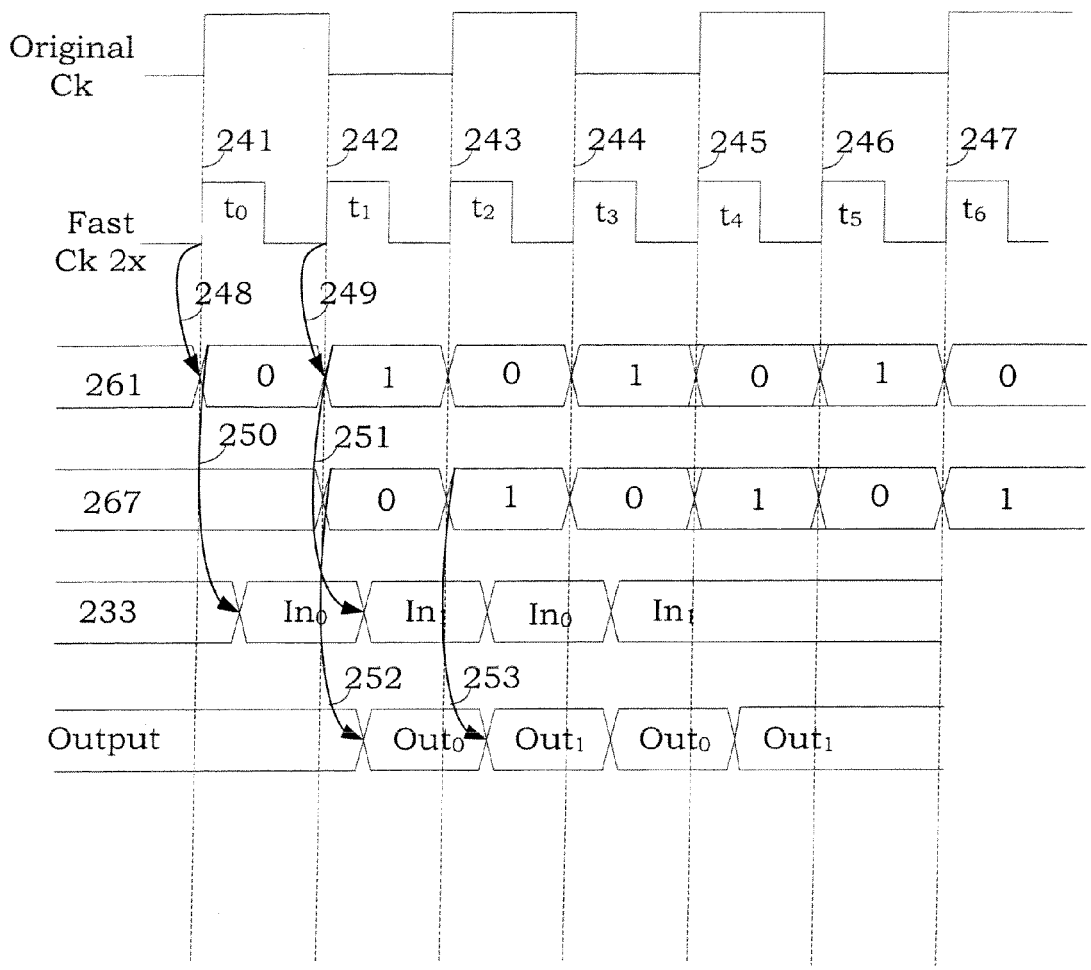
FIG. 2E illustrates a circuit timing diagram demonstrating time-multiplexing among the 2× folded candidates for sharing of FIG. 2D according to an exemplary embodiment of the invention.

This operation is illustrated in more detail in FIGS. 2D-2E. FIG. 2D illustrates resource sharing using a fast-clocked 2× folding transformation among candidates for sharing of FIG. 2A further including a 1-cycle sequential delay according to an exemplary embodiment of the invention. FIG. 2D includes a blow-up view of the "after sharing" portion of the block diagram shown in FIG. 2C. After sharing, shared resource 203 includes a latch 217 which is a sequential logic element known in the art to store an electronic signal (usually as a binary value) in sequence. A latch, such as latch 217, stores a signal value at its input during one phase of the clock signal (e.g., low or high) and allows the signal to pass through "transparently" when the clock signal is in the opposite phase (e.g., high or low). Thus, a sequential delay is incurred for every latch through which a signal must pass in a circuit. This is given by way of illustration and not limitation as other sequential logic elements, for example flip-flops, also contribute to the sequential delay in electronic circuits and systems.

In FIG. 2D, shared resource 203 also includes combinational logic 222 and 223 through which input signals from MUX 205 must pass to reach DeMUX 206. Unlike sequential logic such as latch 217, however, combinational logic does not contribute to the sequential delay across an electronic circuit. Thus, in operation, inputs from MUX 205 will pass through combinational logic 222 and get stored in latch 217 during the first cycle of fast clock 2×. On the next cycle of fast clock 2×, the input value stored in latch 217 will pass through combinational logic 223 and out to the output of DeMUX 206.

MUX 205 and DeMUX 206 are configured in the same way as they were in FIG. 2C. Additionally the delay circuit 211 is configured the same as in FIG. 2C. In this example, the selection logic used in FIG. 2D is a modulo-2 counter 209. However, this is by way of illustration and not of limitation as any selection circuitry or other mechanism known in the art is contemplated to be within the scope of the description. In the illustrated embodiment, the modulo-2 counter 209 is clocked by fast clock 2×. The modulo-2 counter repeatedly counts up through the values 0, 1, and then repeats back to 0 again, and so on. As a result, the modulo-2 counter 209 performs the operation of the selection circuit discussed above by repeatedly placing values of 0 or 1 onto line 261, defining micro-cycle 0 and micro-cycle 1 corresponding to thread_0 and thread_1, respectively. Thus, the modulo-2 counter 209 places values of 0 or 1 onto line 261 feeding into the select input 263 of MUX 205 and the select input 265 of DeMUX 206 via the delay circuit 211.

In case of FIG. 2D, the formula (1 MOD 2)=1 cycle delay, so there will be a 1-cycle delay between the value output from modulo-2 counter 209 onto line 261 and the delayed signal 267. The modulo-2 counter 209 toggles the select inputs of MUX 205 and DeMUX 206 between values of 0 and 1, causing $IN_0$ or $IN_1$ corresponding to $OUT_0$ or $OUT_1$ to be selected, respectively. When the modulo-2 counter 209 outputs a 0 (counts up to 0) on the first cycle of fast clock 2× $IN_0$ of MUX 205 is selected and $OUT_0$ of DeMUX 206 is selected after the 1-cycle delay. The input $IN_0$ previously supplied to clone A 201 is input into the shared resource 203 and propagates through the combinational logic 222, eventually being stored (or latched) at latch 217. On the next cycle of fast clock 2×, the value latched in latch 217 is output from latch 217 and propagates through combinational logic 223 to the input of DeMUX 206. After the 1-cycle delay select line 267 reaches select input 265 of DeMUX 206, and the output $OUT_0$ of DeMUX 206 is selected. The functionality previously performed within clone A 201 is now performed across the shared resource 203 using time-multiplexing.

Likewise, when the modulo-2 counter 209 outputs a 1 (counts up to 1) on the next cycle of fast clock 2×, $IN_1$ of MUX 205 is selected and $OUT_1$ of DeMUX 206 is selected after the 1-cycle delay. Therefore the input $IN_1$ previously supplied to clone B 202 is input into the shared resource 203 where it propagates through the combinational logic 222, eventually being latched at latch 217. On the next cycle of fast clock 2×, the value latched in latch 217 is output from latch 217 and propagates through combinational logic 223 and into the input of DeMUX 206. After the 1-cycle delay select line 267 reaches select input 265 of DeMUX 206, and the output $OUT_1$ of DeMUX 206 is selected. The functionality previously performed within clone B 202 is now performed across the shared resource 203 using time-multiplexing.

These operations are illustrated in detail in FIG. 2E, which illustrates a circuit timing diagram demonstrating time-multiplexing among the 2× folded candidates for sharing of FIG. 2D according to an exemplary embodiment of the invention. As shown, fast clock 2× is accelerated to twice the frequency (2×) of the original system clock Ck as before. In the illustrated embodiment, at time period t0, during the first positive transition of fast clock 2× at 241 (i.e., the transition from 0 to 1), the modulo-2 counter 209 of FIG. 2D counts up to the value 0 and places this value onto line 261 (operation 248). The value 0 on line 261 causes MUX 205 to pass In0 through combinational logic 222, propagate the resulting signal into latch 217 (also clocked by fast clock 2×), and become latched at latch 217 output 233 (operation 250).

Because, in this example, there is 1 sequential logic element, Latch 217, located within the shared resources 203, there will be a 1-cycle delay across the delay circuit 211. Thus, the value at line 267 will be the value at line 261 delayed by 1 cycle. This is illustrates in the timing diagram of FIG. 2E where the 0 value on line 261 at t0 appears on line 267 at t1, the next clock cycle of fast clock 2×.

At time period t1, during the second positive transition of fast clock 2× at 242 the modulo-2 counter 209 of FIG. 2D counts up to the value 1 and places this value onto line 261 (operation 249). The value 1 on line 261 causes MUX 205 to pass In1 through combinational logic 222, propagate the resulting signal into latch 217 (also clocked by fast clock 2×), and become latched at latch 217 output 233 (operation 251). Additionally, at t1, the value 0 on line 267 causes Out0 of DeMUX 206 to be selected (operation 252). The processes repeats for each cycle of fast clock 2×.

Figure 3:
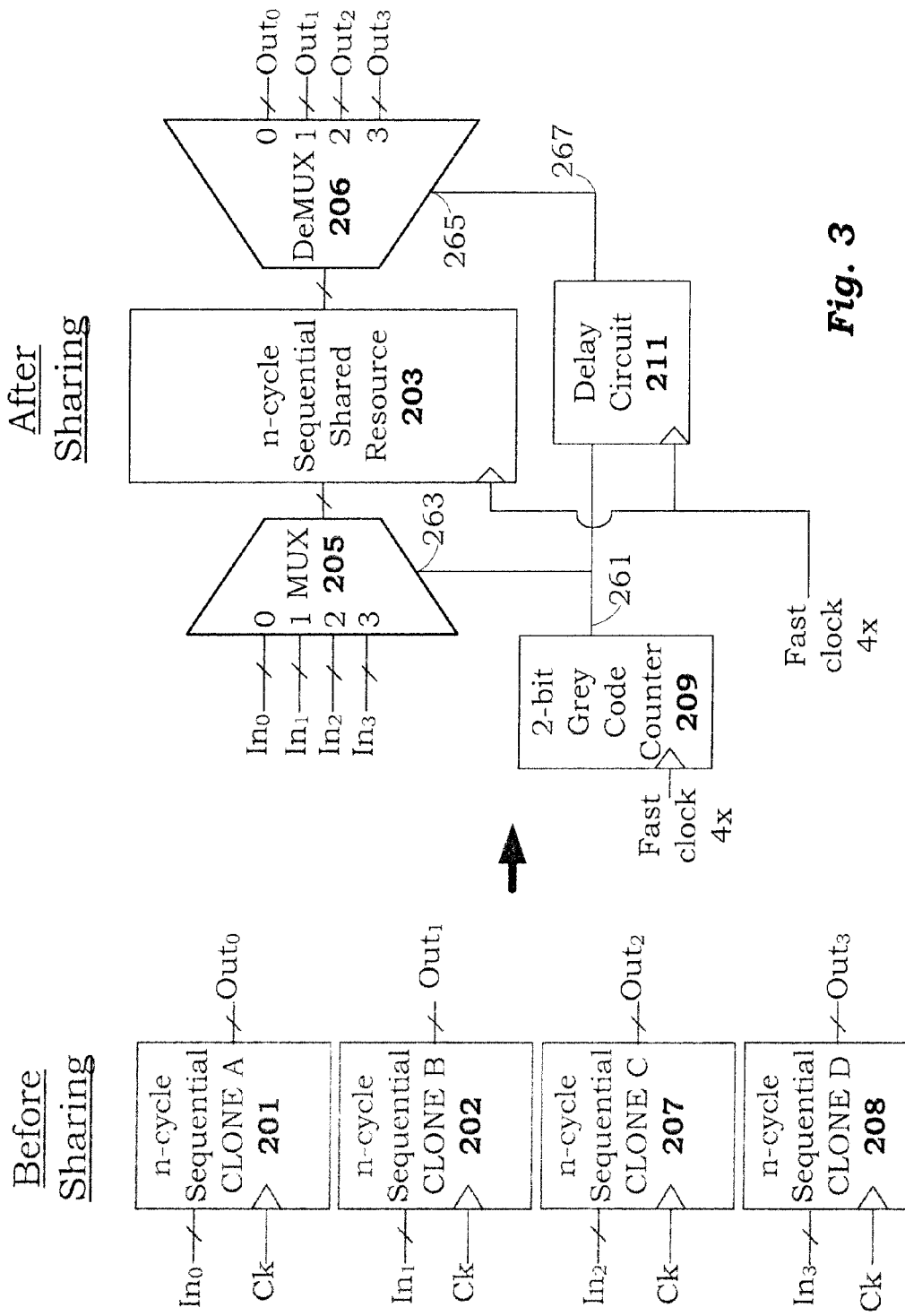
FIG. 3 illustrates resource sharing using a fast-clocked 4× folding transformation among candidates for sharing with an x-cycle sequential delay and different I/O signals according to an exemplary embodiment of the invention.

Embodiments described above have been cast in view of folding two candidates for sharing onto shared resources. The term N-plexing refers to performing the time-multiplexed folding transformations N times based on N identified candidates for sharing. For example, in the cases discussed above, the N-plexing was performed with two (2) same or similar candidates for sharing, clone A 201 and clone B 202. However, the description is not so limited, as any number of candidates for sharing may be identified for sharing circuit resources as long as the corresponding circuitry and/or functionality may be accelerated by N times. FIG. 3 illustrates resource sharing using a fast-clocked 4× folding transformation among candidates for sharing with an x-cycle sequential delay and different I/O signals according to an exemplary embodiment of the invention. In the case of FIG. 3, we now have four (4) subsets of the design which have been identified as candidates for sharing to be folded onto shared resources 203 and time-multiplexed appropriately. Before sharing, x-cycle sequential clone A 201, n-cycle sequential clone B 202, x-cycle sequential clone C 207, and x-cycle sequential clone D 208 are identified as containing same or similar functionality and/or electronic circuitry.

FIG. 3 illustrates N-plexing with the four (4) candidates identified for sharing. These four candidates are now folded onto one set of resources they have in common. Therefore, in this embodiment, four times the functionality is packed into the same shared resource 203. Consequently, a fast clock at four times the frequency of the original system clock, fast clock 4×, must be provided to accomplish four times the work over the shared resources. In the case of 2-plexing the fast clock had to be twice as fast (2×) as the original system clock to perform the functionality of two different candidates for sharing over the same shared resource 203. In the case of FIG. 3, now there are four candidates for sharing, and, therefore, the clock must be accelerated to fast clock 4× so that four times the work can be accomplished across the shared resource 203 in four micro-cycles delimited by fast clock 4×. Additionally, the delay in delay circuit 211 may, in some embodiments, be calculated using the formula, (x MOD n), where x is the sequential delay across each of the candidates for sharing and the shared resource 203 and N is the number of candidates sharing resources as before.

The selection circuit, such as 2-bit Gray Code counter 209, now selects between four (4) different input/output combinations, or threads. In the illustrated embodiment, a 2-bit counter is used to cycle over each of the four threads since a 2-bit counter counts through four values including 0, 1, 2, and 3, and then repeats back to 0. Each of the assigned threads corresponds to one of the counted values as before, but in this case there are four different threads to coordinate among four micro-cycles. A 2-bit Gray Code counter 209 may be used as the selection circuitry. Gray Code is a binary numeral system where two successive binary values differ by only one bit. Gray Code has the characteristic of changing only one bit when incrementing or decrementing through successive binary values. A Gray Code counter may be used, therefore, to cycle through binary values using the fewest possible binary transitions. As a result, the 2-bit Gray Code counter 209 can reduce the amount of power dissipation due to switching transistors within the circuitry. This is important since the selection circuit, in at least certain embodiments, is constantly switching values between 0, 1, 2, and 3 at the fast clock frequency. However, this is given by way of illustration and not limitation, as any selection circuit which repeatedly selects between four different inputs in an organized and coordinated fashion is contemplated within the scope of the invention.

Shared resource 203, the 2-bit Gray Code Counter 209, and the delay circuit 211 are each clocked by fast clock 4×. MUX 205 includes four inputs 0-3 corresponding to $IN_0$, $IN_1$, $IN_2$, and $IN_3$. DeMUX 206 includes four outputs 0-3 corresponding to $OUT_0$, $OUT_1$, $OUT_2$, and $OUT_3$. In the first micro-cycle, say micro-cycle 1, the functionality corresponding to clone A 201 from In0 to Out0 will be performed, in micro-cycle 2 the functionality corresponding to clone B 202 from $IN_1$ to $OUT_1$ will be performed, and likewise in micro-cycles 3 and 4, the functionality of clone C 207 and clone D 208 will be performed, respectively.

Embodiments, therefore, require speeding up the system clock, typically by a factor equal to or less than the number N of candidates for sharing resources. However, faster clocks may also be supported. Embodiments are operable to share resources among any number N of identified sharing candidates as long as the N candidates can be clocked at a clock rate sufficient to process inputs given to the original circuit.

Figure 4:
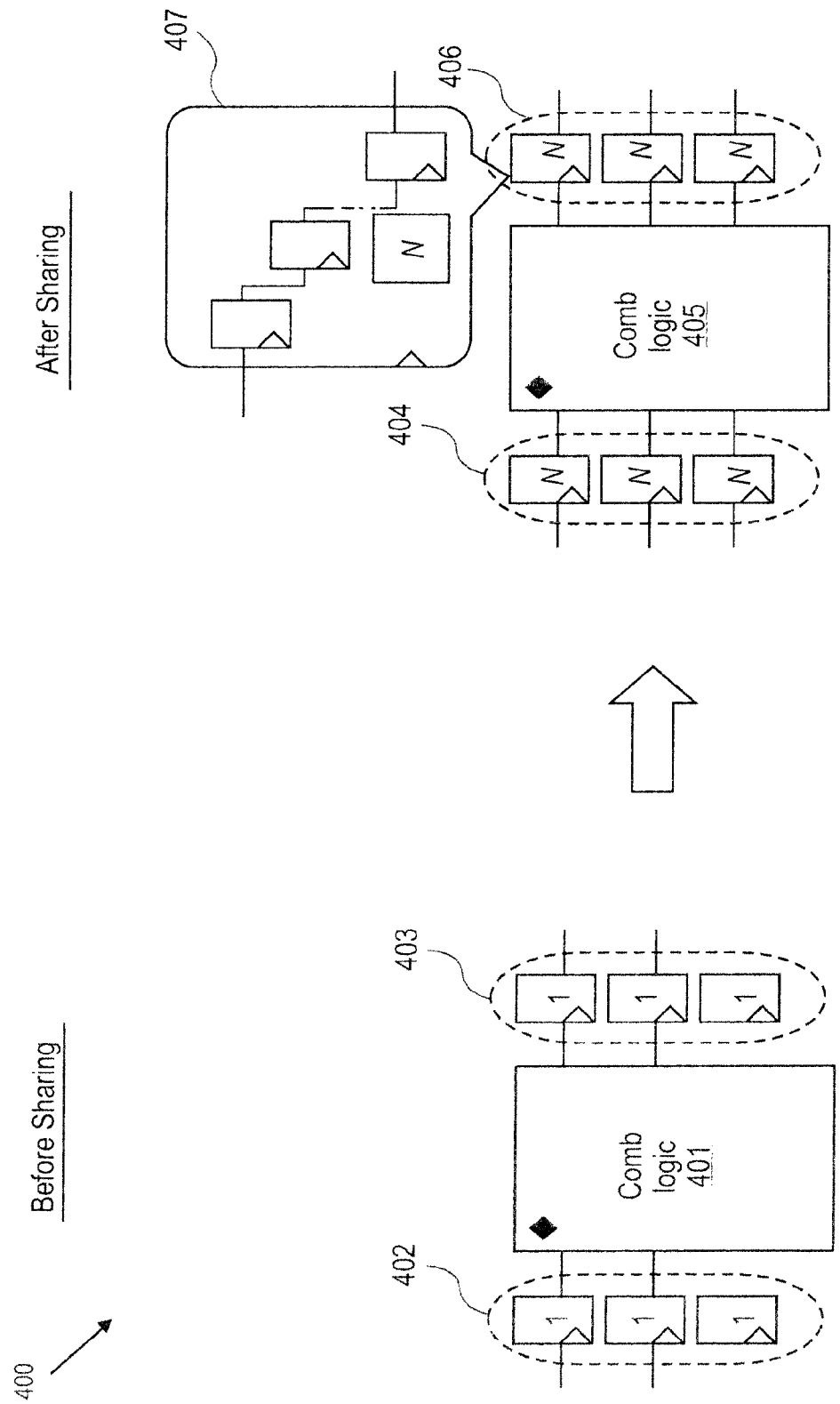
FIG. 4 illustrates an exemplary method for N-plicating state sequential elements within the shared resources according to one embodiment of the invention.
Figure 5A:
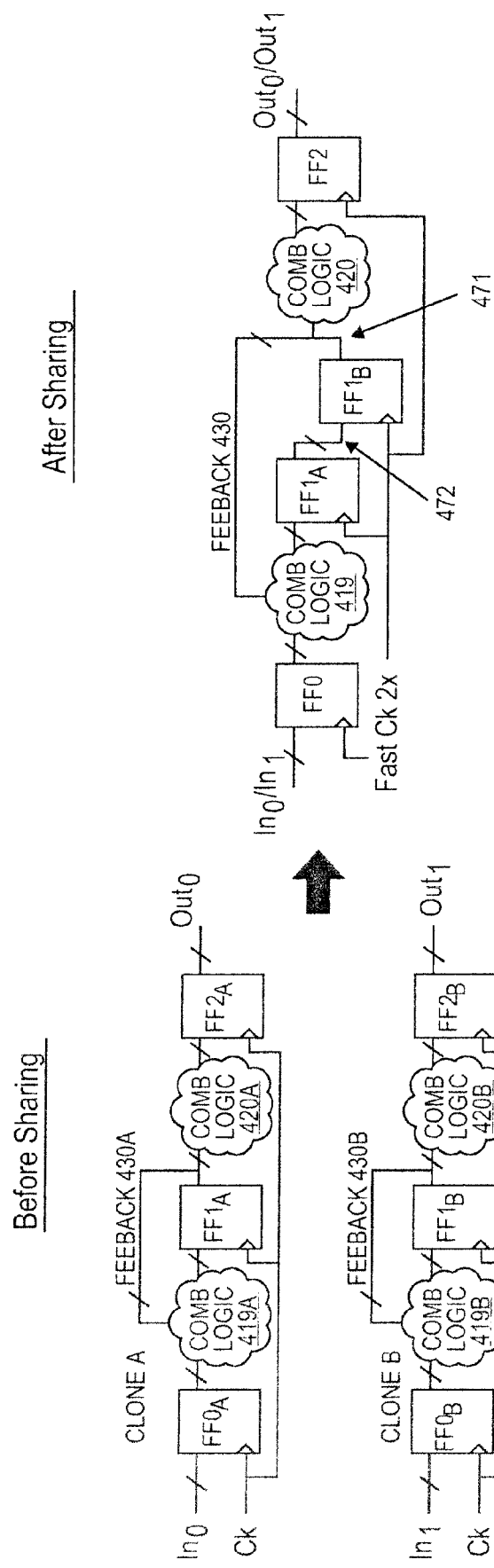
FIG. 5A illustrates resource sharing among candidates for sharing including both pipeline and state sequential elements according to an exemplary embodiment of the invention.

FIG. 4 includes a block diagram illustrating an exemplary method for accounting for state sequential elements within the shared resources according to one embodiment of the invention. Before sharing, circuit 400 includes combinational logic 401 with state sequential elements 402 at the input of combinational logic 401 and state sequential elements 403 at the output. State sequential elements are defined as any sequential logic, such as latches or flip-flops that are located within feedback loops. Referring momentarily to FIG. 5A, clone A shows an example of a sequential element within a feedback loop. In the illustrated embodiment, $FF1_A$ is a state sequential element because of its location within feedback loop 430A. When state sequential elements, such as elements 402 and 403 of FIG. 4, exist in a design to be N-plexed, each state sequential element must be N-plicated. N-plication involves transforming each state sequential element into N sequential elements, where as before, N is the number of candidates N-plexed onto the shared resources. N-plication involves replacing each state sequential element by a chain of N isochronous state elements. In some embodiments, the chain of N isochronous state elements may be implemented as a shift register with N stages. In other embodiments, a memory such as a Random Access Memory (RAM) may be used in place of the chain of N isochronous state elements.

After sharing, in at least certain embodiments, N candidates containing combinational logic 401 and state sequential elements 402 and 403 are folded onto a set of shared resources. The N combinational logic elements 401 are N-plexed onto shared combinational logic 405, and the N state sequential elements 402 and 403 are N-plicated resulting in state sequential elements 404 and 406, respectively, where each of the state sequential elements 404 and 406 contains a chain of N isochronous state elements, denoted N, shown in detail in 407. While it is possible to N-plicate all sequential elements, this is often inefficient. Such complete replication can be avoided if sequential elements are first identified and then categorized as either pipeline or state sequential elements. Pipeline sequential elements only add delay across the snared resources and may be accounted for using delay circuit 211 of FIG. 2A. State sequential elements, in at least certain embodiments, require N-plication.

Whenever a design is being multiplexed N times, each state sequential element must be N-plicated. This is performed to hold the context of each thread. This is shown in more detail in FIGS. 5A and 5B. FIG. 5A illustrates resource sharing among candidates for sharing including both pipeline and state sequential elements according to an exemplary embodiment of the invention. In the illustrated embodiment, before sharing candidate clone A includes sequential elements (flip-flops) $FF0_A$, $FF1_A$, and $FF2_A$ and combinational logic 419A and 420A, and candidate clone B includes $FF0_B$, $FF1_B$, and $FF2_B$ and combinational logic 419B and 420B. Since $FF1_A$ and $FF1_B$ are sequential elements and are contained within feedback loops 430A and 430B, respectively, they are identified as state sequential elements to be N-plicated. Since the remaining flip-flops are not within a feedback loop, they are identified as pipeline sequential elements.

In the illustrated embodiment, after sharing the state sequential logic is N-plicating resulting in a chain of N isochronous state elements $FF1_A$ and $FF1_B$. Note the N state elements $FF1_A$ and $FF1_B$ remain within the feedback loop 430 of the shared resource after sharing. The pipeline sequential elements do not change except for that they are now clocked with fast clock 2×.

Figure 5B:
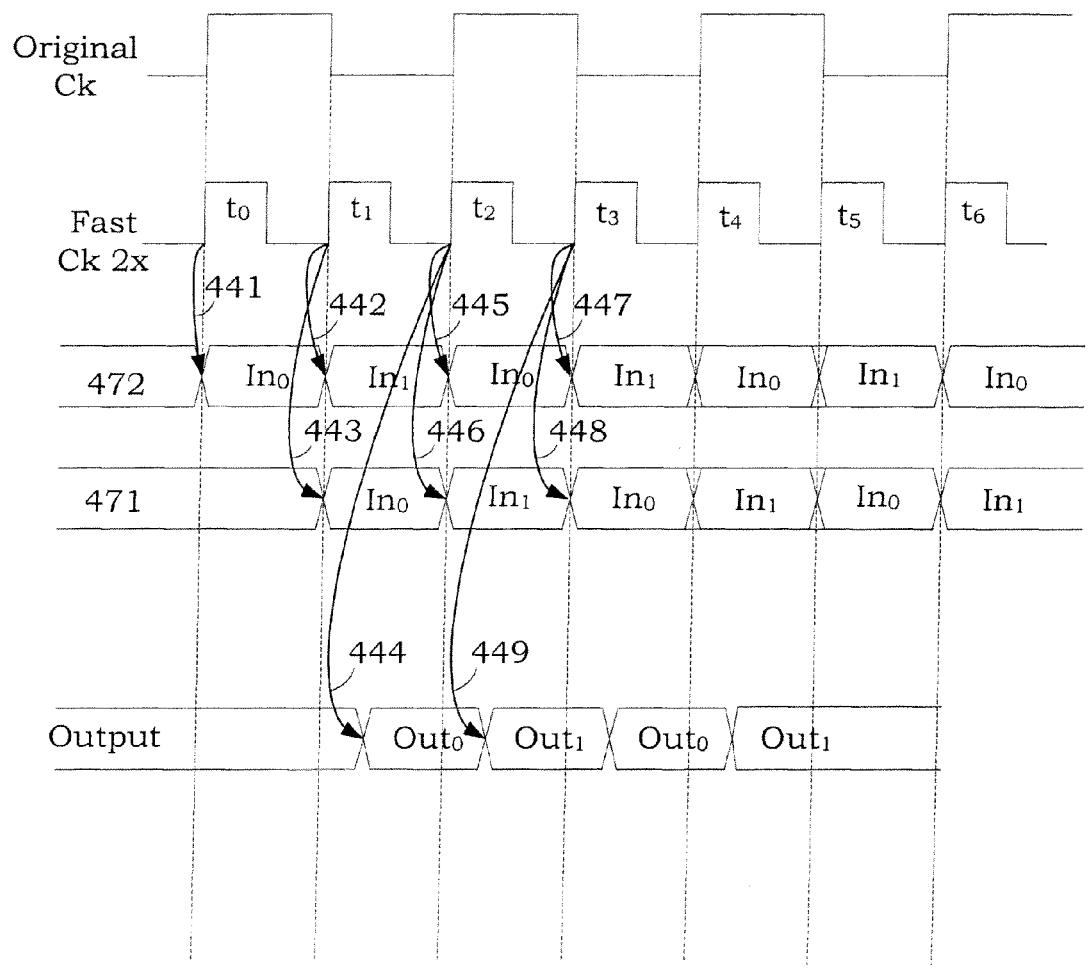
FIG. 5B illustrates a timing diagram demonstrating time-multiplexing among the candidates for sharing of FIG. 5A according to an exemplary embodiment of the invention.

FIG. 5B illustrates a timing diagram demonstrating time-multiplexing among the candidates for sharing of FIG. 5A according to an exemplary embodiment of the invention. At time to, the first positive transition of fast clock 2× occurs. As before, the fast clock 2× is twice the frequency of the original system clock. At time $t_0$, the input $In_0$ (corresponding to thread 0) is selected from a multiplexing circuit such as MUX 205 of FIG. 2A (not shown) and propagates through $FF0_A/FF0_B$. Inc (thread 0) continues propagating through combinational logic 419 and into the first FF1 and is stored (maintained) at the output 472 of the first FF1 until the next clock cycle (operation 441 completes).

At time $t_1$, the second positive transition of fast clock 2× occurs and the value stored at the output 472 of the first FF1 (thread 0) propagates into the second FF1 and is maintained at the output 471 until the next cycle (operation 443 completes). Meanwhile, also at $t_1$, the input $In_1$ (thread 1) is selected from the multiplexing circuit such as MUX 205 of FIG. 2A (not shown) and propagates through $FF0_A/FF0_B$ continuing through combinational logic 419 and into the first FF1 and is maintained at the output 472 of the first FF1 until the next clock cycle (operation 442 completes).

At time $t_2$, the third positive transition of fast clock 2× occurs the value stored at the output 472 of the first FF1 (thread 1) propagates into the second FF1 and is maintained at the output 471 until the next cycle (operation 446 completes). Meanwhile, also at $t_2$, the input $In_0$ (thread 0) is once again selected from the multiplexing circuit such as MUX 205 of FIG. 2A (not shown) and propagates through $FF0_A/FF0_B$ continuing through combinational logic 419 heading toward the first FF1 (operation 445). At the same clock cycle, the value maintained at the output 471 of the second FF1 (thread 0) is split into the feedback path and the feed-forward path. The feed-forward path includes the signal maintained at the output 471 of the second FF1 (thread 0) propagating through combinational logic 420 and into $FF2_A/FF2_B$ where it is maintained at the output $Out_0/Out_1$ of $FF2_A/FF2_B$ (operation 444 completes). The feedback path includes the signal maintained at the output 471 of the second FF1 (thread 0) propagating around the feedback loop 430 and through combinational logic 419 where it is logically combined with values coming from input $In_0$ (also thread 0) through $FF0_A/FF0_B$ and into combinational logic 419. Once the values, each from thread 0, are combined and maintained in the first FF1, operation 445 completes.

At time $t_3$, the fourth positive transition of fast clock 2× occurs the value stored at the output 472 of the first FF1 (thread 0) propagates into the second FF1 and is maintained at the output 471 until the next cycle (operation 448 completes). Meanwhile, also at $t_3$, the input $In_1$ (thread 1) is once again selected from the multiplexing circuit such as MUX 205 of FIG. 2A (not shown) and propagates through $FF0_A/FF0_B$ continuing through combinational logic 419 heading toward the first FF1 (operation 447). At the same clock cycle, the value maintained at the output 471 of the second FF1 (thread 1) is split into the feedback path and the feed-forward path. The feed-forward path includes the signal maintained at the output 471 of the second FF1 (thread 1) propagating through combinational logic 420 and into $FF2_A/FF2_B$ where it is maintained at the output $Out_0/Out_1$ of $FF2_A/FF2_B$ (operation 449 completes). The feedback path includes the signal maintained at the output 471 of the second FF1 (thread 1) propagating around the feedback loop 430 and through combinational logic 419 where it is logically combined with values coming from input $In_1$ (also thread 1) through $FF0_A/FF0_B$ and into combinational logic 419. Once the values, each from thread 1, are combined and maintained in the first FF1, operation 447 completes. This process repeats for each cycle of fast clock 2×. The feedback of the state sequential elements is accounted for by N-plicating the state sequential elements as described. In this manner, the threads running through the shared resources are maintained. Input values of thread 0, for example, are combined with feedback values of thread 0. Likewise input values of thread 1 are combined with feedback values of thread 1. This coordination allows for multiple candidates to share resources that include state sequential elements without mixing up the threads. Thus, N-plicating serves the function of holding the context of each of the threads when resources are shared among N candidates sharing the same hardware resources.

Figure 11C:
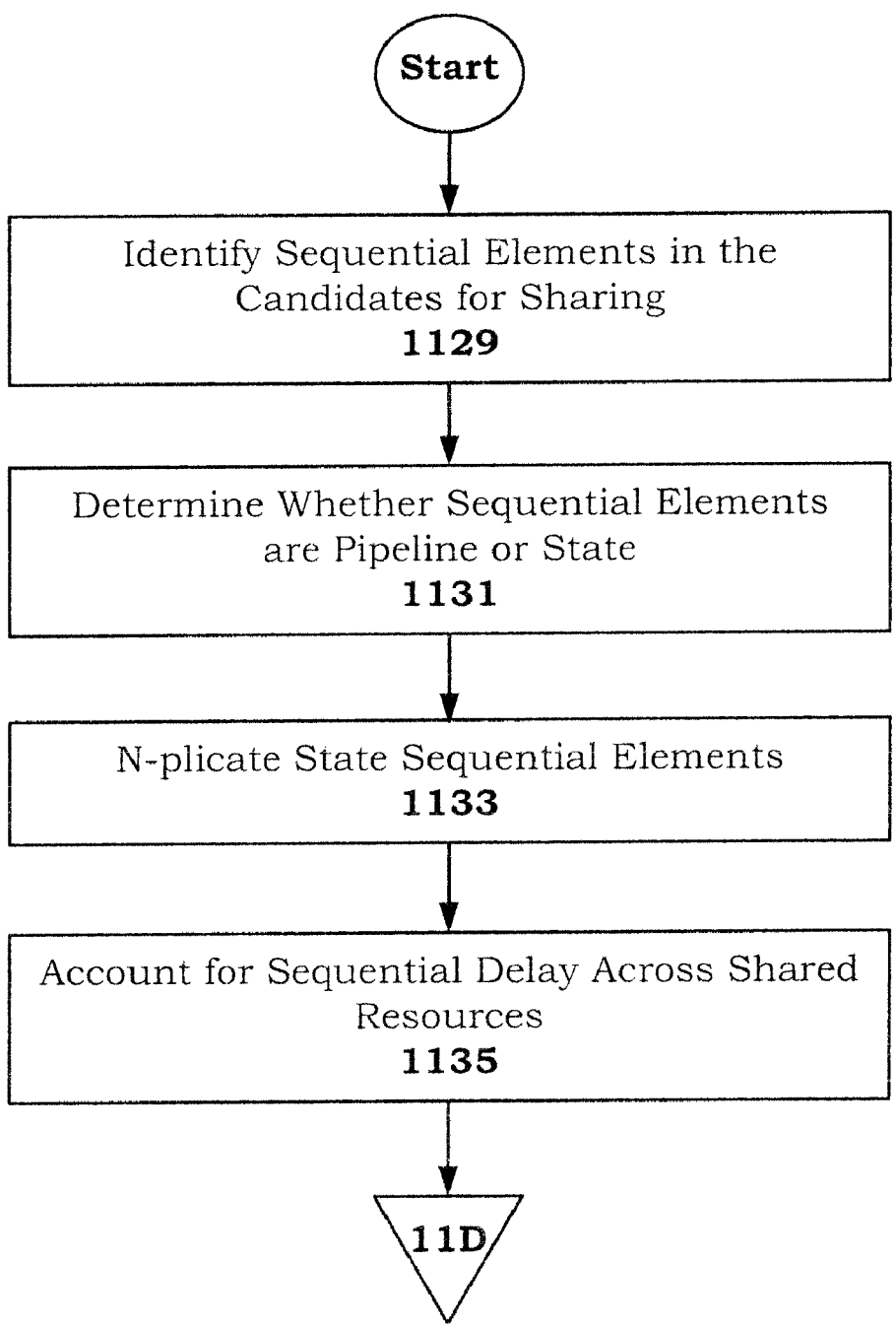
FIG. 11C illustrates accounting for sequential logic in the method of sharing resources through N-plexing of FIGS. 11A-11B according to an exemplary embodiment of the invention.

FIG. 11C illustrates accounting for sequential logic in the method of sharing resources through N-plexing of FIGS. 11A and 11B according to an exemplary embodiment of the invention. In at least certain embodiments, sequential elements within the candidates for sharing must be identified (operation 1129). Next, embodiments determine whether the identified sequential elements are pipeline or state sequential elements (operation 1131). Once the state sequential elements identified, they may be N-plicated as described above (operation 1133). Then, the sequential delay across the shared resources may be determined and accounted for (operation 1135). One such way to account for the sequential delay across the shared resources is to provide a delay circuit, such as delay circuit 211 of FIG. 2A.

As discussed above, known design optimizations can be applied after N-plexing to improve performance, area, power or other parameters. For example, register retiming may distribute N-plicated flip-flops more uniformly through the design and reduce the length of critical paths so as to allow faster clock speed or greater timing slack. In practice, it can be important to the success of this technique because it would spread the N-plexed FFs throughout the design. But this is not required, and can be avoided in some cases.

III. Evaluation and Validation

Figure 11D:
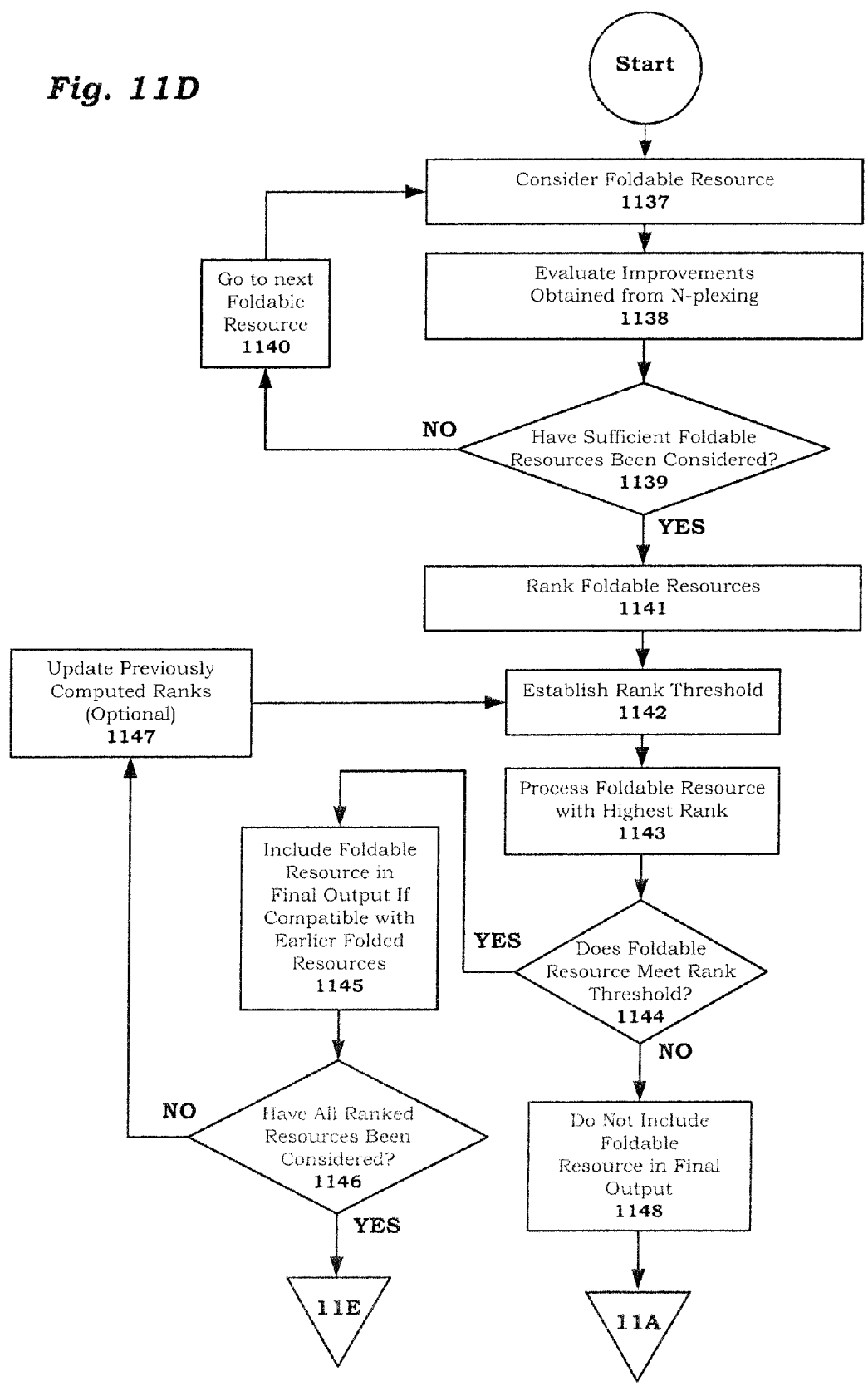
FIG. 11D illustrates a method of evaluating sharing opportunities according to an exemplary embodiment of the invention.

FIG. 11D illustrates a method of evaluating sharing opportunities according to an exemplary embodiment of the invention. After reading the input description of an electronic system, at least certain embodiments identify opportunities for sharing. In at least certain embodiments, each foldable resource (i.e., candidate for sharing) is considered (operation 1137) and the improvements potentially obtained from N-plexing the resource are evaluated (operation 1138). Each foldable resource may be considered separately. At decision block 1139, in the illustrated embodiment, it is determined whether a sufficient number of the identified foldable resources have been considered. If a sufficient number have of foldable resources have not been considered, then control flows to operation 1140 and the next foldable resource is considered. If a sufficient number of foldable resources have been considered, then control flows to operation 1141 where the rank of each foldable resource is evaluated and a rank threshold is established (operation 1142). The rank threshold may be, in at least certain embodiments, the cut-off below which a foldable resource does not provide enough benefit to justify being N-plexed. The rank threshold may be determined based on any number of factors including any combination of the aforementioned optimization parameters. Once each of the foldable resources are ranked and a rank threshold has been established, embodiments begin processing the foldable resources starting with the foldable resource with the highest rank (operation 1143). At decision block 1144, each foldable resource is once again considered, and it is determined whether the foldable resource meets the rank threshold. If not, the foldable resource is not included in the final output of N-plexed resources (operation 1148) and control flows to FIG. 11A. If so, embodiments provide that the foldable resource is N-plexed and included in the final output if the foldable resource is compatible with previous foldable resources already included in the final output (operation 1145). In at least certain embodiments, a foldable resource may not be included in the final output if it is incompatible with previously folded resources. For example, the foldable resource under consideration may be a subset or a superset of a previously folded resource. In these embodiments, the foldable resource may not be included in the final output. Control flows to decision block 1146, where it is determined whether all of the ranked resources have been evaluated. If so, control flows to FIG. 12. If not, control flows to operation 1147, where, optionally, the previously computed ranks are updated, and then control flows back to operation 1142 where the rank threshold may be re-established. Each opportunity for sharing is evaluated, possibly scored, and possibly implemented. Evaluation may be performed by trial implementation, which may or may not be included in the final output depending on whether or not parameters such as actual resource utilization, cost, space, performance metrics, energy, or power consumption are improved. Evaluation can also be performed by estimation.

Figure 12:
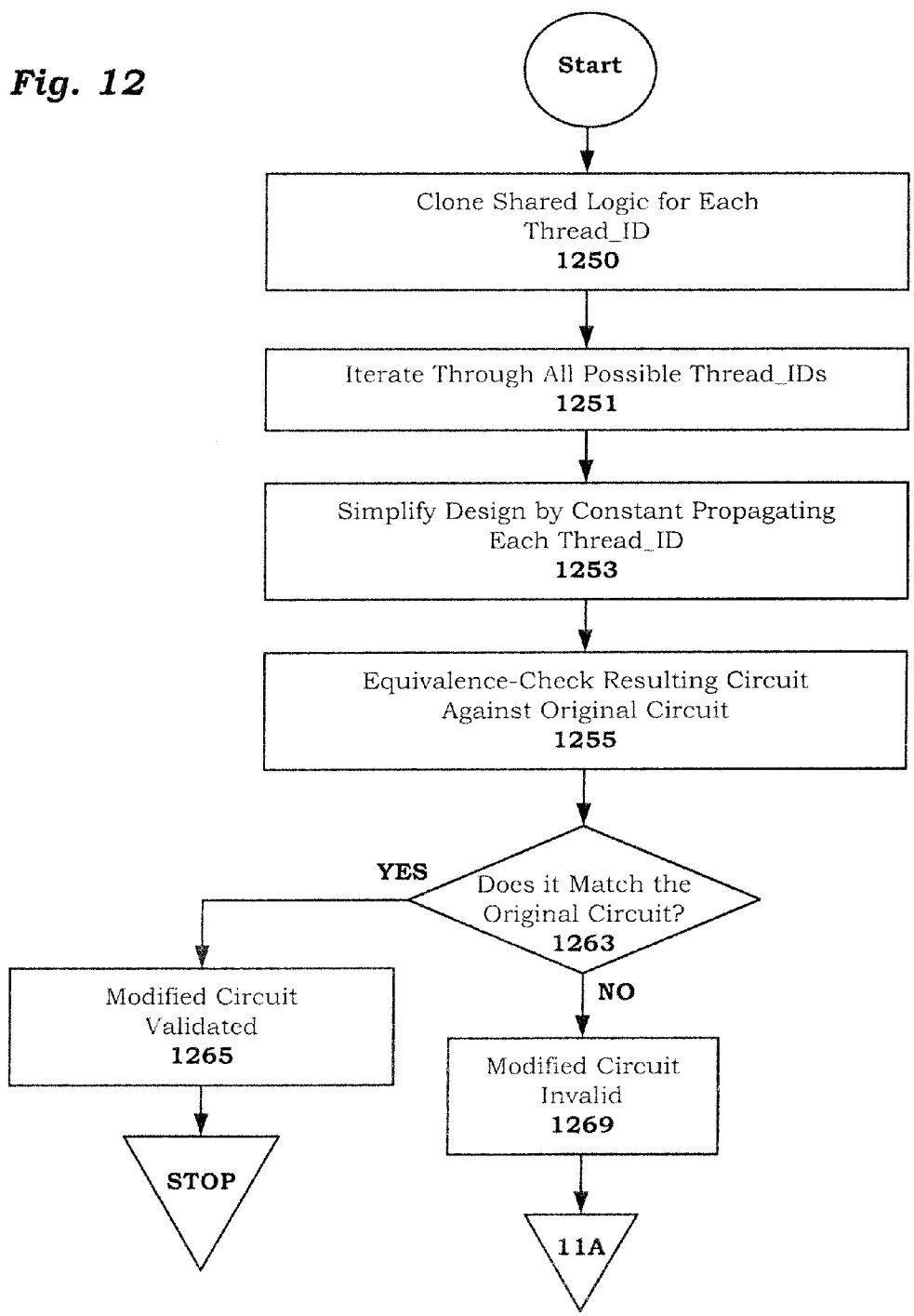
FIG. 12 illustrates a method of validating resource sharing with N-plexing using unfolding according to an exemplary embodiment of the invention.

Embodiments may also verify electronic systems with N-plexed time-shared resources. In at least certain embodiments, validation may be performed by "unfolding" the N-plexed resource to reconstruct the original circuit, functional module, and/or etcetera. FIG. 12 illustrates a method of validating resource sharing with N-plexing using unfolding according to an exemplary embodiment of the invention. In at least certain embodiments, the N-plexed shared resource is unfolded (or unvirtualized) to reconstruct the original circuit design. The reconstructed circuit design is then compared to the original circuit design to validate the N-plexed design. Unfolding is defined as the inverse of folding. Thus, the unfolding of an N-plexed integrated circuit design should yield the original circuit design as it was before folding. In at least certain embodiments, this involves cloning the shared logic for each thread_id (operation 1250), fanning out respective input signals as necessary, and iterating through all possible thread_ids of the thread selection circuit, such as selection circuit 209 of FIG. 2A (operation 1251). Embodiments may then simplify the design by constant-propagation the respective thread_id through each clone to restore the original modules or subcircuits (operation 1253). Constant propagation is the process of substituting values of known constants into expressions. In this case, the thread_ids are the known constants which may be propagated to simplify the circuit. This constant-propagation of thread_ids creates disconnected time-slices where the multiplexing circuitry is no longer present (MUXes and DeMUXes are removed from the N-plexed circuit). Another effect of constant propagating the thread_ids is that the fast clock will become a dangling wire which can then be removed. Control flows to operation 1255 where the resulting circuit is equivalence-checked against the corresponding sections of the original design. Modern techniques such as techniques based on simulation and SAT may quickly prove equivalence of the resulting design. At operation 1263, if the disconnected time-slices do not match the original circuit, control flows to operation 1269 where the circuit is invalidated. If there is a match, the modified circuit design is validated (operation 1265).

In other embodiments, validation may be performed using well known simulation-driven techniques. One such technique includes toggling the I/O of the folded resource using a plurality of input/output combinations and comparing the results to the same simulation performed on the original circuit. For example, the same movie for an MPEG4 circuit may be driven into the inputs of a folded resource and determining whether the outputs or performance of the folded resource differ.

IV. Dealing with Memories

Figure 8A:
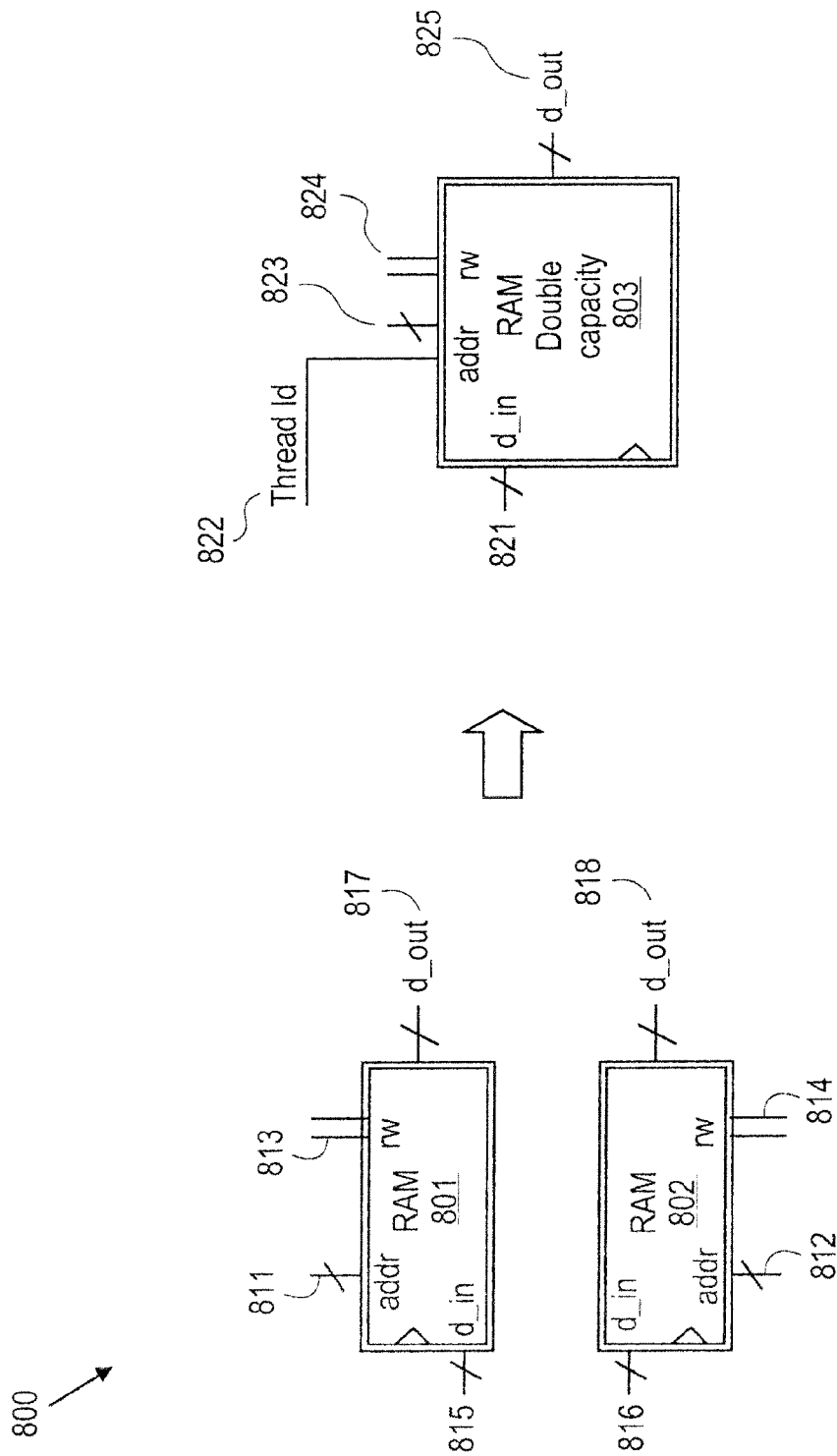
FIG. 8A illustrates resource sharing in memories with one or more unused address ports according to an exemplary embodiment of the invention.

Since a memory element must retain its value over many cycles, one such element cannot be shared by several threads of execution. However, if one fixed-sized memory module is used below capacity at all times, another module may fit in the unused address space. A pair of same-sized modules used below 50% capacity (a frequent case for FPGAs) admit easy consolidation into one existing memory. When memory modules are shared, one or more extended address bits may serve to logically select between the original modules without requiring a selection circuit or a multiplexing circuit. FIG. 8A illustrates resource sharing in memories with one or more unused address ports according to an exemplary embodiment of the invention. In at least certain embodiments, memories such as RAM 801 and RAM 802 may be identified as candidates for sharing or may be any subset of identified candidates for sharing. If RAM 801 and RAM 802 include at least one unused address port, they may be shared using N-plexing without requiring a multiplexing circuit. In FIG. 8A, RAM 801 includes data_in port 815, address port 811, read/write ports 813 and data_out port 817. Likewise, RAM 802 includes data_in port 815, address port 811, read/write ports 813 and data_out port 817. An example of memory addressing with one unused address port is demonstrated in FIG. 8B, which illustrates a side-by-side comparison of configurations of memory address bits. On the left-hand-side of FIG. 8B an example of a 4-bit addressable memory with one unused address bit is demonstrated. In this example, the most-significant bit (MSB) is unused. As a result, addressable memory locations within the memory are limited to address locations accessible with 3 bits. Such a memory includes only eight (8) addressable memory locations (see FIG. 8C). However, on the right-hand-side of FIG. 8B, an example of 4-bit addressable memory with no unused address bits is demonstrated. In this case, the addressable memory locations within the memory include all memory locations accessible with the full 4-bit address. Such a memory includes sixteen (16) addressable memory locations, which is double that of the left-hand-side. This is demonstrated further in FIG. 8C, which illustrates a side-by-side comparison of addressable memory locations using 3-bit and 4-bit addressing, respectively. The consequence of using 3-bit addressing, such as that depicted on the left-hand-side of FIG. 8C is that only a total of 8 (0 to 7) addressable memory locations are available to store data. In contrast, the consequence of using 4-bit addressing, such as that depicted on the right-hand-side of FIG. 8C is that a total of 16 (0 to 15) addressable memory locations are available to store data. Thus, every additional memory address bit (or port) results in doubling the capacity of a memory by providing twice the addressable memory locations.

Thus, in FIG. 8A, if RAM 801 and RAM 802 each have an unused address port, then they will each only support half the addressable memory locations that would be otherwise available. After sharing using N-plexing, each of RAM 801 and RAM 802 can be packed into a shared memory with double capacity using the unused address port as a thread identifier (thread_id). For example, in FIG. 8B, if $bit_3$ is used as the thread_id, then when thread_id, $bit_3=0$, the first eight addressable locations may be accessed. These first eight addressable locations may be assigned to one of the foldable memories, RAM 801 or RAM 802. Likewise, when thread_id, $bit_3=1$, the second eight addressable locations may be accessed. These second eight addressable locations may be assigned to the other of the foldable memories, RAM 801 or RAM 802. This folding technique results in a shared memory such as RAM 803 of FIG. 8A with double capacity. RAM 803 includes a data_in port 821, read/write ports 824 and data_out port 825. However, the MSB of the available address ports 823 of RAM 803 is used as a thread_id 822, to select between the contents of RAM 203 which correspond to the folded candidates RAM 801 and RAM 802. Thus, the value of thread_id 822 may be used to select between RAM 801 and RAM 802 within shared RAM 803. During circuit operation, a decoder built into each RAM is used to decode memory addresses and place them onto the address ports of a memory. In this case, the built-in decoder can be leveraged to provide the multiplexing between each of the candidates sharing double capacity RAM 803. This can be done without the need for a multiplexing circuit such as MUX 205 described in connection with FIG. 2A.

Figure 13A:
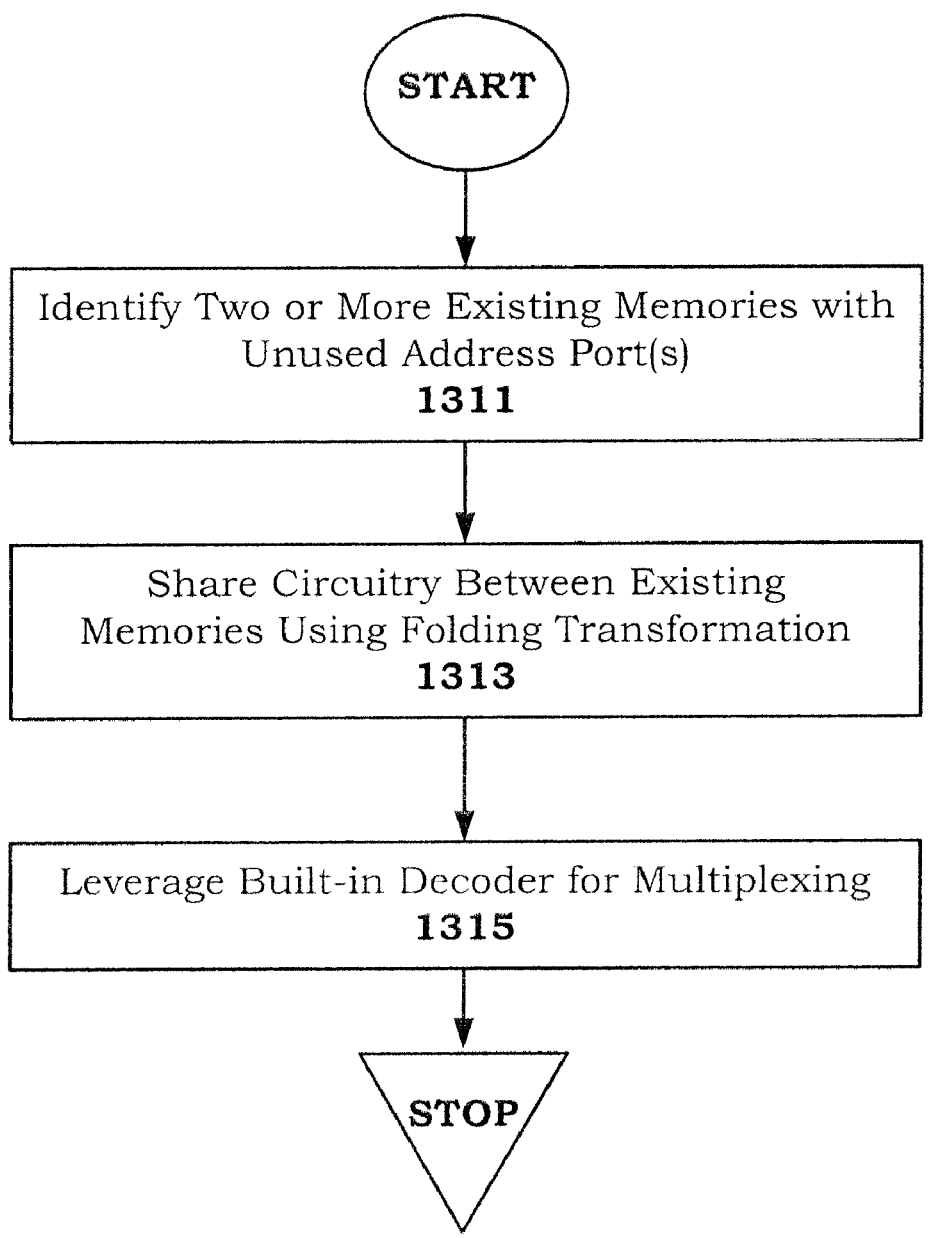
FIG. 13A illustrates a method resource sharing among memories with one or more unused address ports according to an exemplary embodiment of the invention

FIG. 13A illustrates resource sharing among memories with one or more unused address ports according to an exemplary embodiment of the invention. In at least certain embodiments, two or more existing memories with one or more unused address ports are identified (operation 1311). Resources are shared among the two or more memories using folding transformation where the unused address bit may be used as a thread_id to switch between the two or more memories sharing resources (operation 1313). Finally, embodiments leverage built-in decoders to perform the multiplexing (operation 1315).

Figure 9:
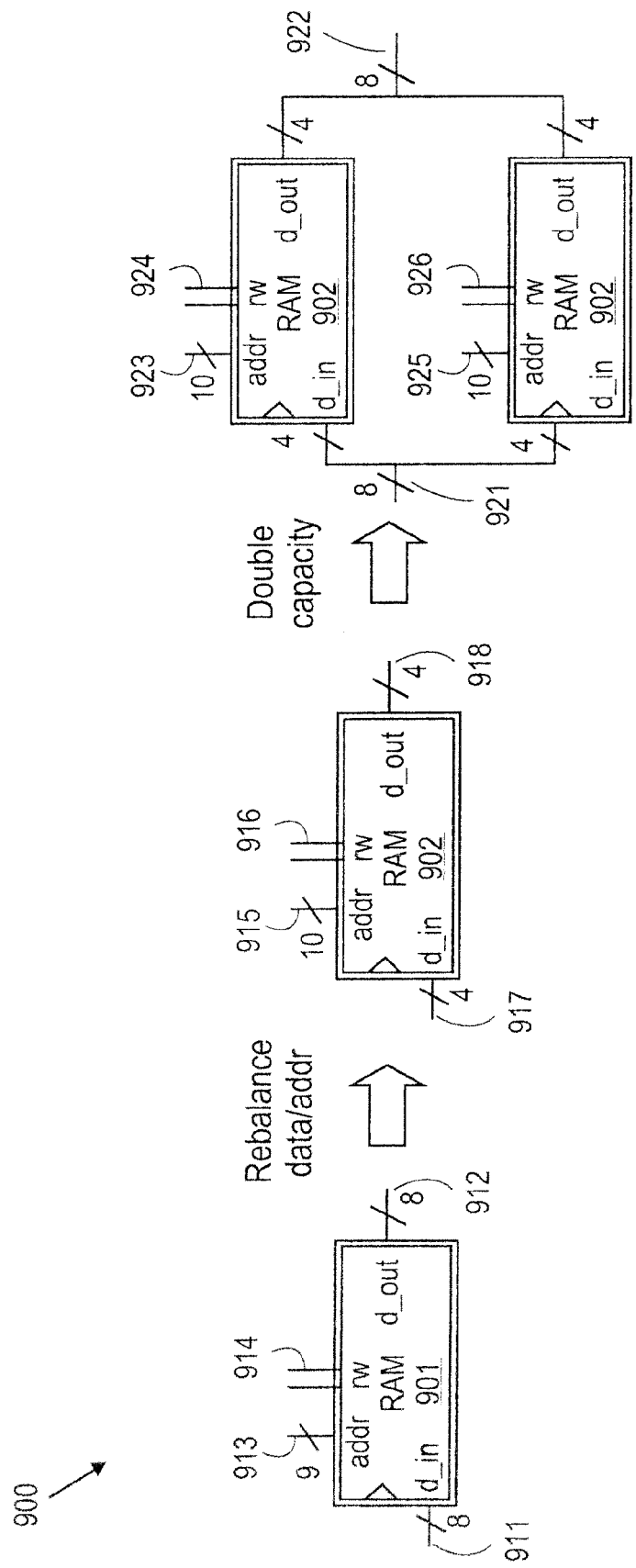
FIG. 9 illustrates resource sharing in memories according to an exemplary embodiment of the invention.

Embedded memories are often found in foldable resources being N-plexed. When memory blocks are taken from a library of pre-designed components, the new memory blocks may not match any known configuration. This may occur when folding a largest available RAM. For example, there may not be another RAM of the same size to share resources with a largest available RAM. If the largest available RAM includes ten (10) address ports, and the only other RAM available for sharing includes only nine (9) address ports, then they don't match and cannot be folded as described in FIG. 8. The same problem arises even more frequently with FPGAs which include pre-manufactured memories. FIG. 9 illustrates connecting equivalent memory blocks to offer twice the capacity according to an exemplary embodiment of the invention In at least certain embodiments, memories of equal size can be matched for resource sharing. This is shown on the left-hand-side of FIG. 9 where RAMs 902 are connected together to offer twice the capacity in the folded circuit. However, in some cases, two RAMs of the same size may not be available. In this case, existing RAMs may be rebalanced to share resources. In FIG. 9, RAM 901 includes an 8-bit data_in port 911, an 8-bit data_out port 912, a 9-bit address port 913, and read/write ports 914. Thus, RAM 901 may be rebalanced to match other instances of RAM 902. Here, the ability of FPGA and ASIC design environments to reconfigure memory I/O for fixed capacity may be utilized. Embodiments provide rebalancing of RAM 901 including adding at least one additional address port to the existing memory structure and reducing the set of data ports by one half. Once the memory is rebalanced, it may be combined with other RAMs 902 assumed to be available in the library of memories or within the folded circuit.

Figure 13B:
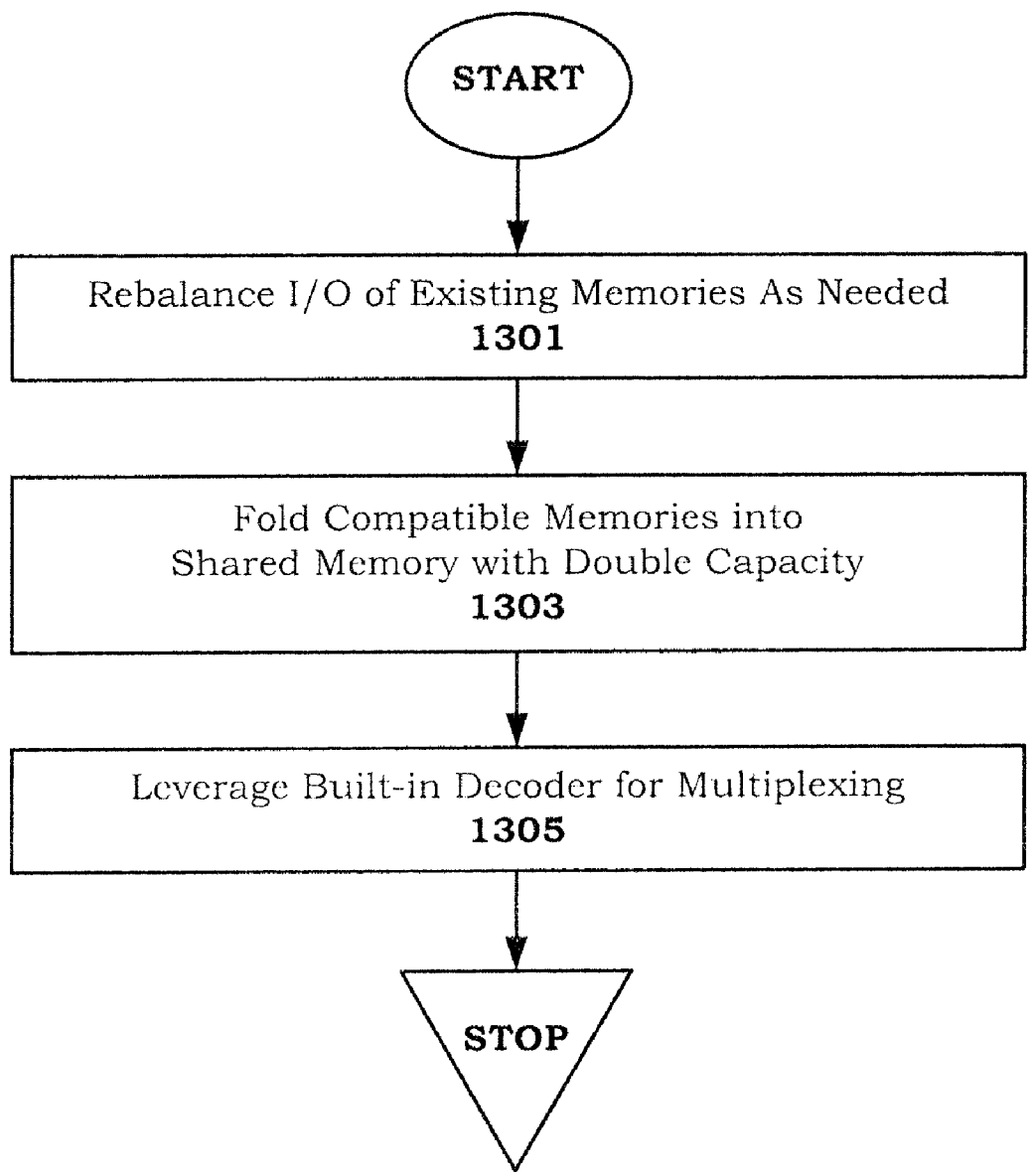
FIG. 13B illustrates a method of resource sharing among memories according to an exemplary embodiment of the invention

FIG. 13B illustrates a method of resource sharing among memories according to an exemplary embodiment of the invention. In at least certain embodiments, memories may be rebalanced as necessary (operation 1301). If, for example, existing memories are not compatible in size among each other, then a rebalancing may be required to match memory structures in order to perform folding techniques on them. In these cases, existing memories may be rebalanced by adding address lines and removing data lines in a fashion similar to the exemplary embodiment of FIG. 9. This operation may be followed by sharing circuitry between the existing memories by folding compatible memories (rebalanced or otherwise) into a shared memory of double capacity (operation 1303). Finally, embodiments leverage built-in decoders to perform the multiplexing (operation 1305). In this manner, existing memories may be combined through rebalancing when memory configurations differ.

V. Using Built-In Features

Figure 6A:
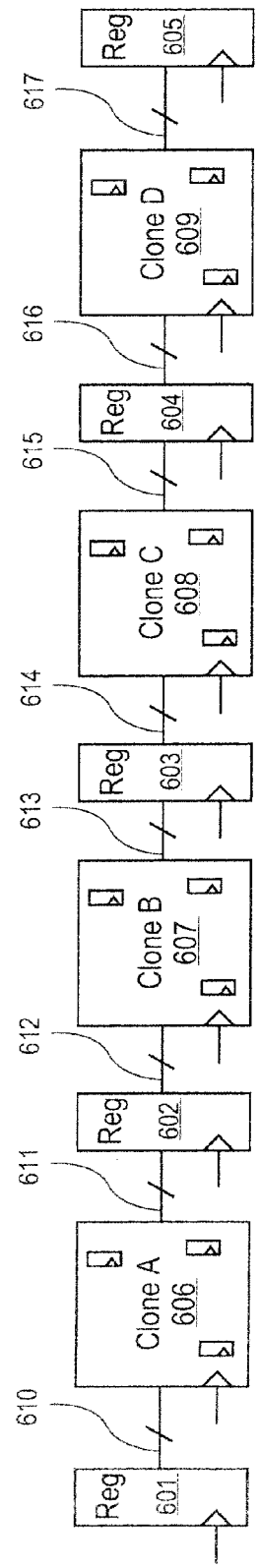
FIG. 6A illustrates loop unrolling.

In the case of memories, existing built-in decoders and registers may be leveraged without requiring additional multiplexing circuitry. For example, the multiplexing and demultiplexing circuitry in FIG. 2A may each be unnecessary since the built-in address decoder may be leveraged to provide the multiplexing and the registers within the memory may provide the demultiplexing. However, other configurations exist as opportunities for sharing using built-in features of an integrated circuit design. For example, unrolled loops commonly contain duplicative circuitry and/or functionality. FIG. 6A illustrates loop unrolling. Looping structures, such as the example depicted in the top left-hand-side of FIG. 6A, are a common technique for programming code. Looping structures are used in programming for a variety of different reasons and may take any number of different forms based on the programming language. The upper-right-hand-side of FIG. 6A shows the unrolled version of the example looping structure shown on the upper-left-hand-side of the figure. Further, the lower portion of FIG. 6A demonstrates an example of a circuit generated in hardware based on the unrolled loop in the upper-right-hand-side of the figure. For each iteration in a looping structure, the unrolled loop may include same or similar circuitry and/or functionality as depicted in the lower portion of FIG. 6A. In the figure, the same or similar circuitry includes clone A 606, clone B 607, clone C 608, and clone D 609. Likewise, the unrolled loop will also typically include registered inputs and outputs coupled with the same or similar circuitry and/or functionality. The registered I/O Includes reg 601, reg 602, reg 603, reg 604, and reg 605. At the end of each iteration through a looping structure, the index value (in this case j) and variables (in this case data) must be updated and stored for use in the next loop iteration. Thus, in at least certain embodiments, stored values from each iteration of a looping structure may be stored in registered outputs/inputs.

Figure 6B:
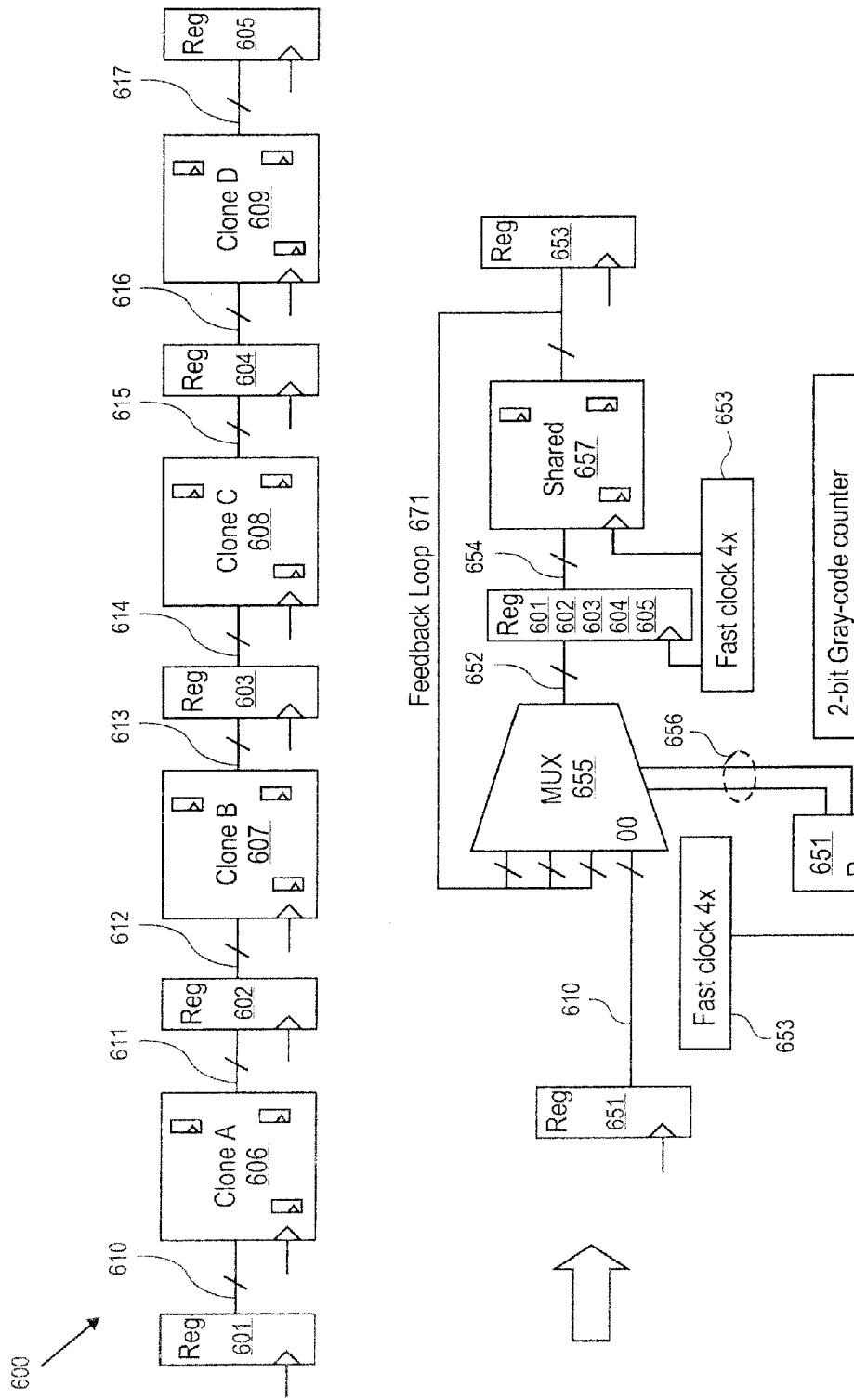
FIG. 6B illustrates loop re-rolling according to an exemplary embodiment of the invention.

As a result, there is often numerous duplicative circuitry and/or functionality contained within unrolled loops. This circuitry may provide opportunities for sharing. One method to optimize circuitry and/or functionality such as that shown in the lower portion of FIG. 6A is loop re-rolling. Referring to FIG. 6B, which illustrates loop re-rolling according to one embodiment of the invention. In the upper portion of FIG. 6B, an unrolled loop similar to the one depicted in FIG. 6A. In at least certain embodiments, the unrolled loop can be re-rolled to take advantage of sharing opportunities. The lower portion of FIG. 6B illustrates a re-rolled loop corresponding to the unrolled loop above in the upper portion of the figure. In this case, for each iteration of the unrolled loop, same or similar circuitry and/or functionality may be found and identified as foldable resources. For example, potential foldable resources of FIG. 6B may include clone A 606, clone B 607, clone C 608, and clone D 609. In addition, potential foldable resources of FIG. 6B may also include reg 601, reg 602, reg 603, reg 604, and reg 605.

Once the foldable resources are identified and determined to be within an unrolled loop, they may be N-plexed according to the configuration depicted in FIG. 6B. Each iteration of the loop is now registered at reg 601/602/603/604/605 which is a shared version of registers reg 601, reg 602, reg 603, reg 604, and reg 605. Moreover, the duplicative circuitry contained within clone A 606, clone B 607, clone C 608, and clone D 609 may be folded onto shared resource 657. The feedback loop 671 models the looping structure, such as the looping structure depicted in the upper-left-hand-side of FIG. 6A. For each iteration, values are looped back into MUX 655 and registered at reg 601/602/603/604/605. On the next iteration, the registered values will available to shared resource 657. Once again, the amount of candidates sharing resources determines the fast clock frequency, in this case up to 4× the original system clock. A 2-bit Gray Code counter 651 is used as the selection circuit and the registered outputs are placed in reg 653, thus avoiding the need for an output demultiplexer in this configuration.

Figure 15:
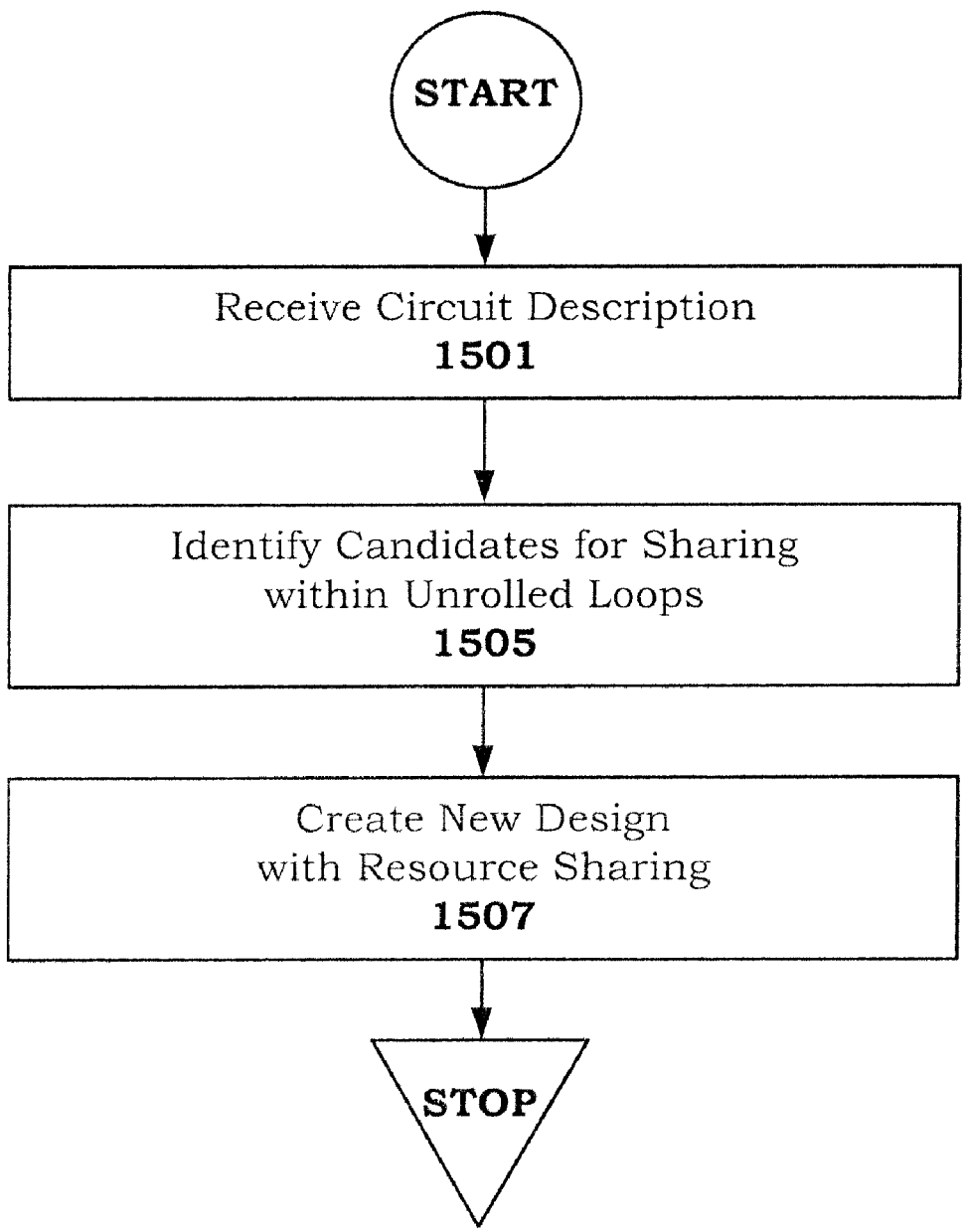
FIG. 15 illustrates a method for identifying opportunities for sharing by re-rolling unrolled loops using a folding transformation according to an exemplary embodiment of the invention

FIG. 15 illustrates a method for identifying opportunities for sharing by re-rolling unrolled loops using a folding transformation according to an exemplary embodiment of the invention. In at least certain embodiments, a description and/or other design of an integrated circuit are received (operation 1501) and candidates for sharing are identified which are located in unrolled looping structures (operation 1505). Once the candidates for sharing within unrolled loops are identified, then resources may be shared using a folding transformation as depicted in the lower portion of FIG. 6B to create a modified circuit design with fewer resources (operation 1507). In this way, unrolled loops may be re-rolled to take advantage of resource sharing opportunities to optimize integrated circuit designs.

Other configurations exist as opportunities for sharing using built-in features of an integrated circuit design. For example, FIG. 7 illustrates resource sharing among I/O clients connected to an I/O bus according to an exemplary embodiment of the invention. In at least certain embodiments, I/O clients may be shared according to the principles of this description. Exemplary circuit design 700 includes I/O clients clone 1 702, clone 2, 703, clone 3 704 and clone 4 705 each coupled with the I/O bus 701 as depicted in the figure. Additionally, design 700 includes I/O connections 711-714 corresponding to each of the I/O clients respectively. After sharing, each of the I/O clients may be folded onto common circuitry (shared 720) and time-multiplexed using bus 701. Since there are four (4) foldable resources in this case, a fast clock of 4× is utilized. Additionally, selection circuit 722 in this case includes a simple flip-flop toggled directly with fast clock. In FIG. 7, the bus 701 may be leveraged to provide the multiplexing. Signals sent to and from the bus may be controlled by a bus controller, which may be configured to select among the inputs corresponding to each of the foldable resources, clone 1 702, clone 2, 703, clone 3 704 and clone 4 705, sharing resources across shared resource 720. In this manner, the multiplexing and demultiplexing functionality is provided by the bus 701 itself. Thus, the multiplexor and demultiplexor (such as MUX 205 and DeMUX 206 in FIG. 2A) are no longer necessary.

Figure 10A:
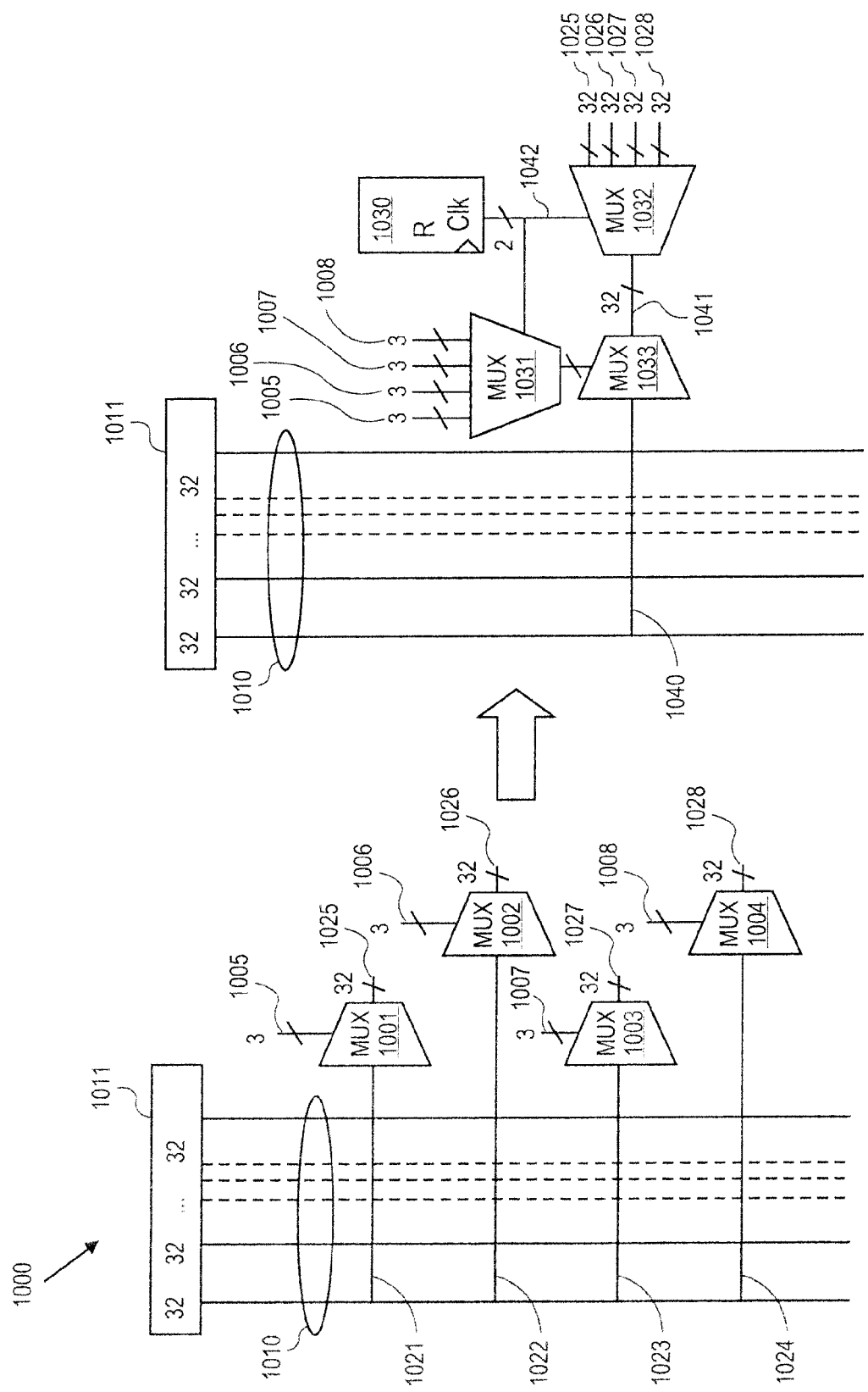
FIG. 10A illustrates performing a folding transformation on a crossbar coupled with multiplexor selection circuits according to one embodiment of the invention.
Figure 10B:
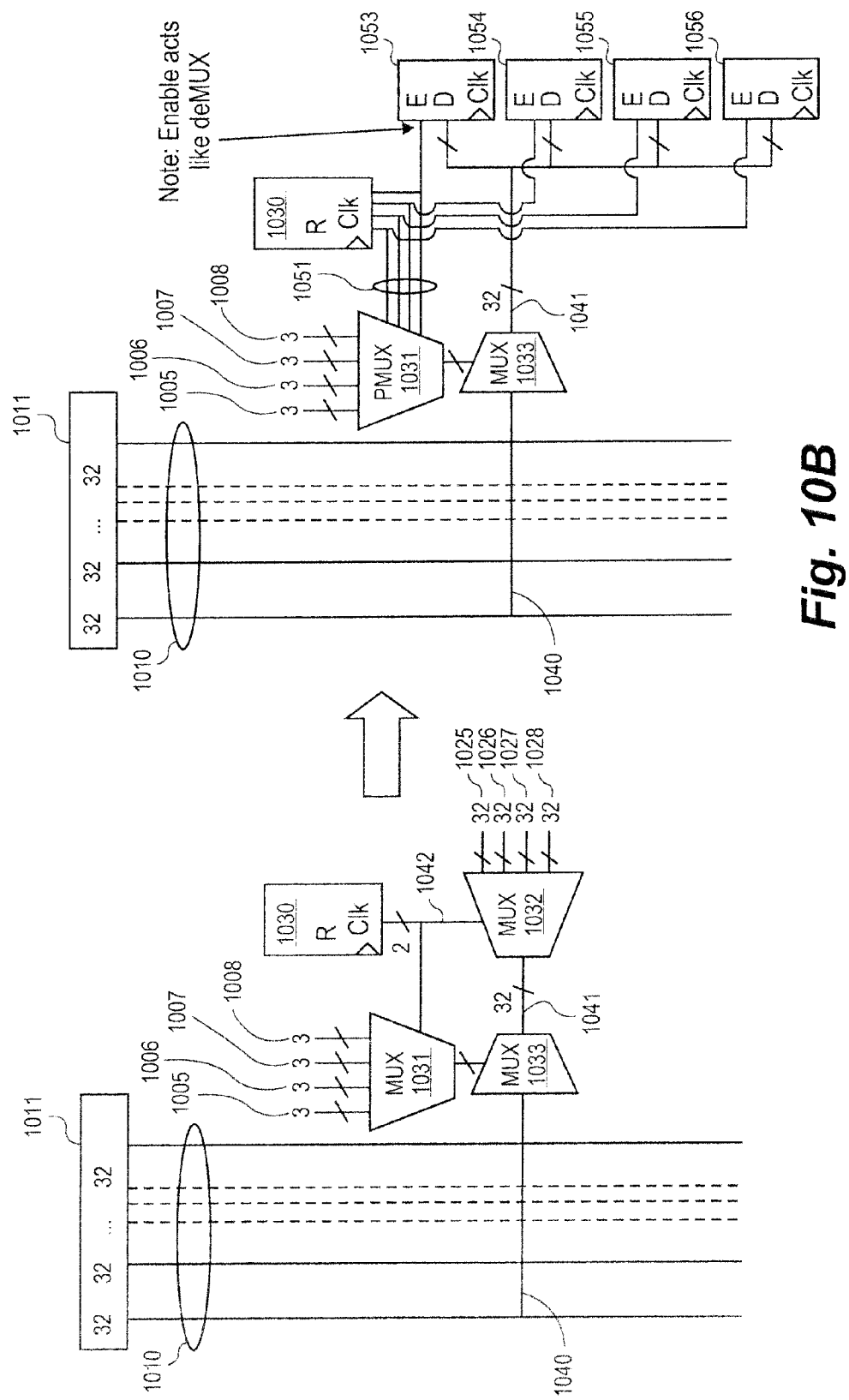
FIG. 10B illustrates performing a folding transformation on a crossbar coupled with multiplexor selection circuits according to another embodiment of the invention.

Additional examples of circuitry and/or functionality that may be identified as foldable are depicted in FIGS. 10A-10B. FIG. 10A illustrates performing a folding transformation on a crossbar coupled with multiplexor selection circuits according to one embodiment of the invention. In at least certain embodiments, the crossbar 1011 may be implemented using 32-bit buses 1010. Before sharing, each of MUXes 1001 through 1004 is coupled with each of the 32-bit buses and acts as a pass selection circuit to allow one of the coupled buses on the inputs 1021, 1022, 1023, and 1024 to pass to the outputs 1025, 1026, 1027, and 1028 of MUXes 1001 to 1004 respectively. In the illustrated embodiment, each of MUXs 1001 through 1004 contain a 3-bit selection inputs 1005, 1006, 1007, and 1008, respectively, and each include 32-bit inputs 1021, 1022, 1023, and 1024, respectively. Each of MUXes 1001 through 1004 also includes 32-bit outputs 1025, 1026, 1027, and 1028 respectively. Depending on the value on the 3-bit select inputs, the corresponding 32-bit input from the 32-bit buses 1010 of crossbar 1011 are allowed to pass.

After folding transformation, each of the multiplexors 1001, 1002, 1003, and 1004 are folded onto shared MUX 1033 and the selection inputs 1005 through 1008 are selected using an additional MUX 1031. Further, the outputs are demultiplexed using a demultiplexor 1032 to demultiplex the output of shared MUX 1033 into outputs 1025 through 1028 previously supplied by the folded MUXes 1001 to 1004, respectively. As before, selection circuit 1030 may be, in the illustrated case, a flip-flop toggled with fast clock. In this configuration, one 32-bit MUX may be used to share resources among many foldable 32-bit MUXes as illustrated. However, this configuration includes a little more multiplexing overhead than is optimal. FIG. 10B illustrates performing a folding transformation on a crossbar coupled with multiplexor selection circuits according to another embodiment of the invention. In this figure, the folded circuit in FIG. 10A is further optimized by replacing the demultiplexor 1032 with output-enabled latches (or flops) 1053, 1054, 1055 and 1056. Additionally, a PMUX 1031 is used instead of a normal MUX 1031 to provide a one-hot scenario on the output enable lines used to select which output-enabled latch will pass the value output from shared MUX 1033. The output-enabled latches 1053 to 1056 act as the demultiplexor circuit. Whenever one of the select inputs 1005 to 1008 are selected, the corresponding output-enabled latch 1053 to 1056 is correspondingly selected.

Figure 14:
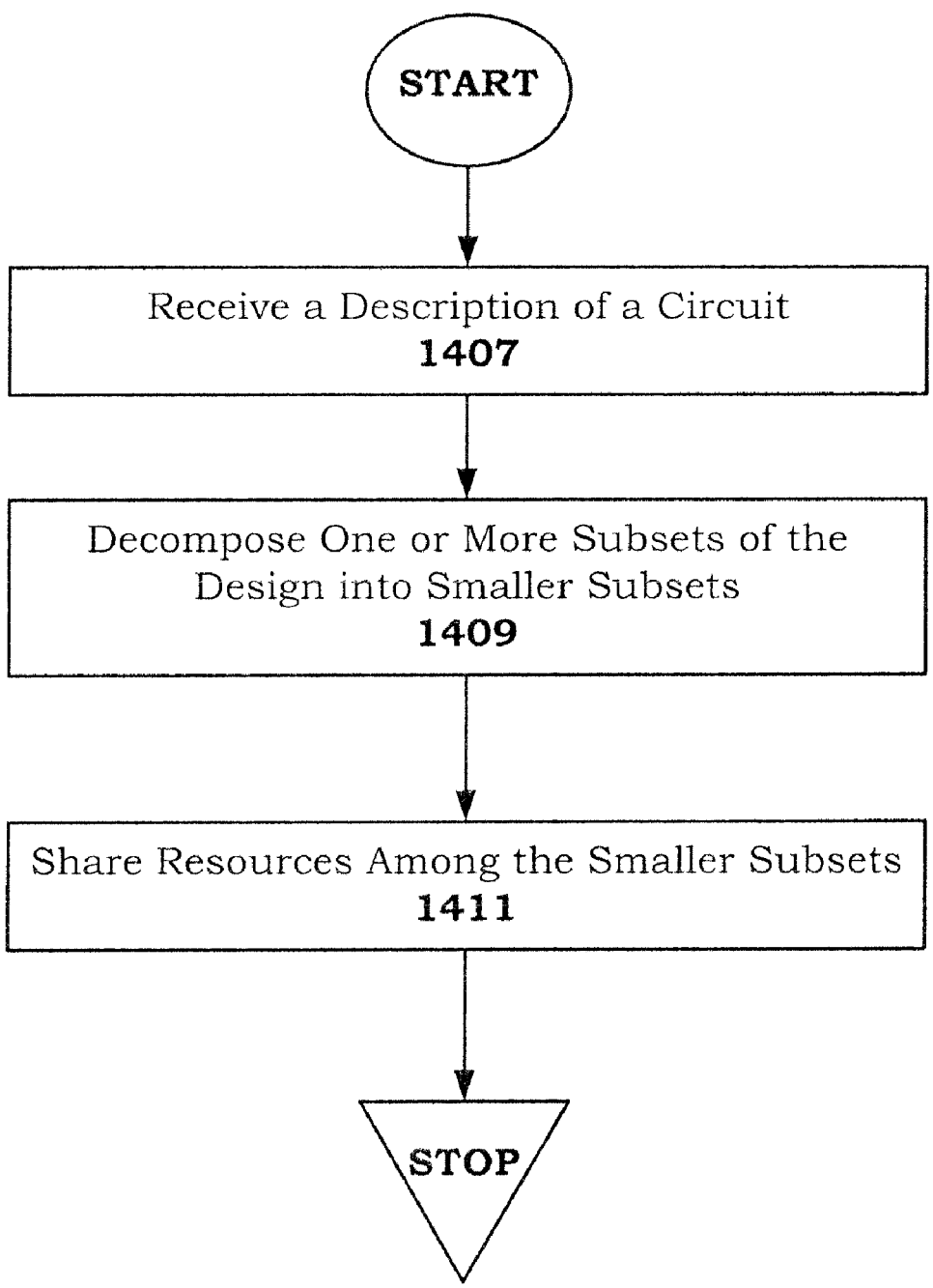
FIG. 14 illustrates a method of decomposing one or more subsets of a design into smaller subsets for resource sharing according to an exemplary embodiment of the invention.

In some cases, the foldable resources may be identified by decomposing pieces of the design into smaller pieces and looking for sharing opportunities among the smaller pieces. FIG. 14 illustrates a method of decomposing one or more subsets of a design into smaller subsets for resource sharing according to an exemplary embodiment of the invention. In at least certain embodiments, a design and/or other description of an integrated circuit is received (operation 1407) and one or more subsets of the design are decomposed into smaller subsets to look for sharing opportunities (operation 1409). After foldable resources are identified among the smaller subsets of the design, resources may be shared among the smaller subsets (operation 1411). In this way, additional resource sharing opportunities may be discovered.

Figure 16:
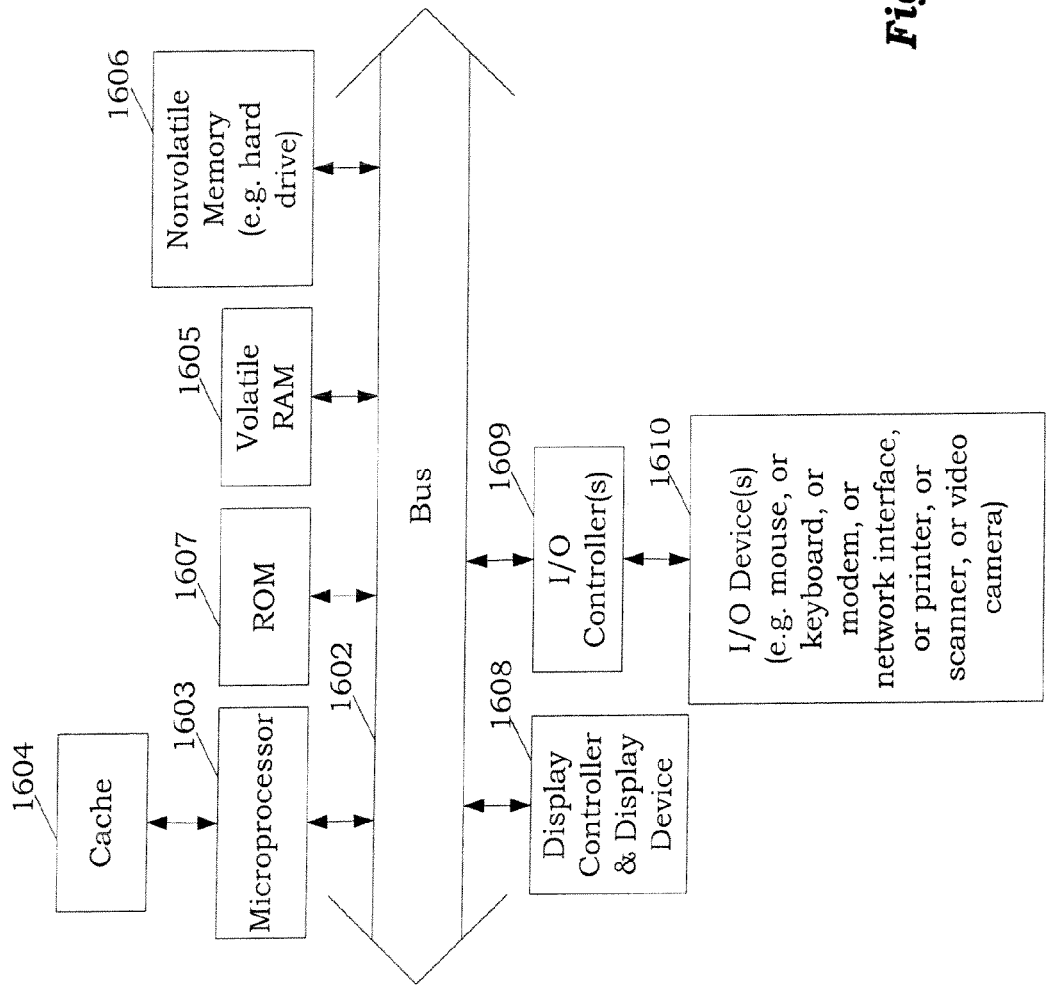
FIG. 16 illustrates an exemplary data processing system upon which the methods and apparatuses of the invention may be implemented.

FIG. 16 shows one example of a typical data processing system, such as data processing system 1600, which may be used with the present invention. Note that while FIG. 16 illustrates various components of a data processing system, it is not intended to represent any particular architecture or manner of interconnecting the components as such details are not germane to the present invention. It will also be appreciated that network computers and other data processing systems which have fewer components or perhaps more components may also be used. The data processing system of FIG. 16 may, for example, be a workstation, or a personal computer (PC) running a Windows operating system, or an Apple Macintosh computer.

As shown in FIG. 16, the data processing system 1601 includes a system bus 1602 which is coupled to a microprocessor 1603, a ROM 1607, a volatile RAM 1605, and a non-volatile memory 1606. The microprocessor 1603, which may be a processor designed to execute any instruction set, is coupled to cache memory 1604 as shown in the example of FIG. 16. The system bus 1602 interconnects these various components together and also interconnects components 1603, 1607, 1605, and 1606 to a display controller and display device 1608, and to peripheral devices such as input/output (I/O) devices 1610, such as keyboards, modems, network interfaces, printers, scanners, video cameras and other devices which are well known in the art. Typically, the I/O devices 1610 are coupled to the system bus 1602 through input/output controllers 1609. The volatile RAM 1605 is typically implemented as dynamic RAM (DRAM) which requires power continually in order to refresh or maintain the data in the memory. The non-volatile memory 1606 is typically a magnetic hard drive or a magnetic optical drive or an optical drive or a DVD RAM or other type of memory systems which maintain data even after power is removed from the system. Typically, the non-volatile memory 1606 will also be a random access memory although this is not required. While FIG. 16 shows that the non-volatile memory 1606 is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface (not shown). The system bus 1602 may include one or more buses connected to each other through various bridges, controllers and/or adapters (not shown) as is well known in the art. In one embodiment the I/O controller 1609 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software, hardware, firmware, or in combination thereof. That is, the techniques may be carried out in a computer system or other data processing system in response to its processor, such as a microprocessor, executing sequences of instructions contained in a memory, such as ROM 1607, volatile RAM 1605, non-volatile memory 1606, cache 1604 or a remote storage device (not shown). In various embodiments, hardwired circuitry may be used in combination with software instructions to implement the present invention. Thus, the techniques are not limited to any specific combination of hardware circuitry and software or to any particular source for the instructions executed by the data processing system 1600. In addition, throughout this description, various functions and operations are described as being performed by or caused by software code to simplify description. However, those skilled in the art will recognize that what is meant by such expressions is that the functions result from execution of code by a processor, such as the microprocessor 1603.

A machine readable medium can be used to store software and data which when executed by the data processing system 1600 causes the system to perform various methods of the present invention. This executable software and data may be stored in various places including for example ROM 1607, volatile RAM 1605, non-volatile memory 1606, and/or cache 1604 as shown in FIG. 16. Portions of this software and/or data may be stored in any one of these storage devices.

The invention also relates to apparatus for performing the operations herein. This apparatus may be specially constructed for the required purposes, or it may comprise a general purpose computer selectively activated or reconfigured by a computer program stored in the computer. Such a computer program may be stored or transmitted in a machine-readable medium. A machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media such as, but not limited to, a machine-readable storage medium (e.g., any type of disk including floppy disks, optical disks, CD-ROMs, and magnetic-optical disks, read-only memories (ROMs), random access memories (RAMs), EPROMs, EEPROMs, flash memory, magnetic or optical cards, or any type of media suitable for storing electronic instructions), or a machine-readable transmission (but not storage) medium such as, but not limited to, any type of electrical, optical, acoustical or other form of propagated signals (e.g., carrier waves, infrared signals, digital signals, etc.).

Additionally, it will be understood that the various embodiments described herein may be implemented with data processing systems which have more or fewer components than system 1600; for example, such data processing systems may be a cellular telephone or a personal digital assistant (PDA) or an entertainment system or a media player (e.g., an iPod) or a consumer electronic device, etc., each of which can be used to implement one or more of the embodiments of the invention.

Throughout the foregoing specification, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. When a particular feature, structure, or characteristic is described in connection with an embodiment, it is submitted that it is within the knowledge of one skilled in the art to bring about such a feature, structure, or characteristic in connection with other embodiments whether or not explicitly described. Various changes may be made in the structure and embodiments shown herein without departing from the principles of the invention. Further, features of the embodiments shown in various figures may be employed in combination with embodiments shown in other figures.

In the description as set forth above and claims, the terms "coupled" and "connected," along with their derivatives, may be used. It should be understood that these terms are not intended to be synonymous with each other. Rather, in particular embodiments, "connected" is used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some portions of the detailed description as set forth above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Additionally, some portions of the detailed description as set forth above use circuits and register-transfer level (RTL) representations to exemplify the invention. Such examples do not express limitations of the invention, and the methods taught herein are also applicable to behavioral descriptions and software programs.

It should be borne in mind, however, that ail of these and similar terms are to be associated with the appropriate physical quantities and are merely convenient labels applied to these quantities. Unless specifically stated otherwise as apparent from the discussion as set forth above, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Additionally, the algorithms and displays presented herein are not inherently related to any particular computer system or other apparatus. Various general purpose systems may be used with programs in accordance with the teachings herein, or it may prove convenient to construct more specialized apparatuses to perform the method operations. The structure for a variety of these systems appears from the description above. In addition, the invention is not described with reference to any particular programming language. It will be appreciated that a variety of programming languages may be used to implement the teachings of the invention as described herein.

Embodiments of the invention may include various operations as set forth above or fewer operations or more operations or operations in an order which is different from the order described herein. The operations may be embodied in machine-executable instructions which cause a general-purpose or special-purpose processor to perform certain operations. Alternatively, these operations may be performed by specific hardware components that contain hardwired logic for performing the operations, or by any combination of programmed computer components and custom hardware components.

Throughout the foregoing description, for the purposes of explanation, numerous specific details were set forth in order to provide a thorough understanding of the invention. It will be apparent, however, to one skilled in the art that the invention may be practiced without some of these specific details. Accordingly, the scope and spirit of the invention should be judged in terms of the claims which follow as well as the legal equivalents thereof.

What is claimed is:

1. A method to optimize an integrated circuit comprising:
receiving a description of a design of the integrated circuit;
identifying two or more subsets of the design having similar functionality, but with one or more different input/output (I/O) signals, as candidates for sharing;
generating a shared subset of the design resulting from sharing circuit resources among each of the candidates for sharing using a folding transformation, the folding transformation including folding the candidates for sharing onto a set of circuit resources common to each, and time-multiplexing among operations of each of the candidates for sharing;
determining which of the candidates for sharing can be operated at a higher clock-frequency; and
performing the time-multiplexing of the candidates for sharing at the higher clock-frequency in alternating micro-cycles delimited by cycles of a fast clock, wherein at least one of the receiving, identifying, generating, determining, and performing is performed by a processor.

2. The method of claim 1, wherein the candidates for sharing include one or more of the following: candidates with identical functionality; candidates with similar functionality; a collection of connected candidates for sharing; a collection of candidates for sharing not all of which are connected; candidates for sharing with logic around them; candidates for sharing with functionality similar to a subset of other candidates for sharing; and candidates for sharing replaceable by a specially-designed super-module.

3. The method of claim 2, wherein additional selection circuitry is used to select out functionality which differs between each of the candidates for sharing.

4. The method of claim 1, further comprising:
determining which of the candidates for sharing include temporally-disjoint functions; and
performing the time-multiplexing of the candidates for sharing with temporally-disjoint functions using a clock derived from one or multiple system clocks of the original circuit.

5. The method of claim 4, wherein the fast clock is obtained by one of accelerating the original system clock of the circuit, enriching the circuit with one or more additional clock signals, or multiplexing one or more clocks.

6. The method of claim 5, wherein the fast clock is faster than the speed of the one or multiple system clocks by up to a factor n, wherein n is equal to a number of candidates for sharing folded onto the shared circuit resources.

7. The method of claim 6, wherein the time-multiplexing between operations of each of the candidates for sharing further comprises generating a multiplexing circuit to time-multiplex inputs corresponding to each of the candidates for sharing.

8. The method of claim 7, wherein generating the multiplexing circuit comprises:
reconnecting inputs previously supplied to each of the candidates for sharing to inputs of a multiplexor; and
connecting an output of the multiplexor to an input of the shared subset of the design.

9. The method of claim 8, wherein the time-multiplexing between operations of each of the candidates for sharing further comprises generating a demultiplexing circuit to time-demultiplex outputs received from the shared subset of the design.

10. The method of claim 9, wherein generating the demultiplexing circuit comprises:
connecting an output of the shared subset of the design to an input of the demultiplexing circuit to receive the time-multiplexed outputs from the shared subset of the design; and reconnecting outputs previously supplied from each of the candidates for sharing to outputs of the demultiplexing circuit.

11. The method of claim 10, further comprising:
assigning threads to each of the candidates for sharing; and
coordinating the time-multiplexed signals through the shared subset of the design based on the assigned threads.

12. The method of claim 11, wherein the demultiplexing circuit is implemented as a demultiplexor to distribute the time-multiplexed output signals from the shared subset of the design to a set of receiving logic, wherein the demultiplexor includes select inputs to select among the receiving logic based on the assigned threads.

13. The method of claim 11, wherein the demultiplexing circuit is a set of output-enabled sequential circuits to distribute time-multiplexed output signals from the shared subset of the design to a set of receiving logic, wherein each of the set of output-enabled sequential circuits includes an enable input to enable selection among the receiving logic based on the assigned threads.

14. The method of claim 11, wherein the demultiplexing circuit is a fanout circuit to distribute time-multiplexed output signals from the shared subset of the design to a set of receiving logic, and wherein the receiving logic each includes enable signal inputs to enable selection among the receiving logic based on the assigned threads.

15. The method of claim 11, wherein the assigning threads to each of the candidates for sharing and coordinating the time-multiplexed signals through the shared subset of the design based on the assigned threads is accomplished using a selection circuit to switch among threads by toggling select lines coupled with select inputs of the multiplexing circuit and to toggle select lines coupled with the select inputs of the demultiplexing circuit.

16. The method of claim 15, wherein the selection circuit is a modulo-n counter, wherein n is the number of candidates for sharing folded onto the shared circuit resources.

17. The method of claim 16, further comprising adding a sequential delay of zero or more cycles to the select lines coupled with the select inputs of the demultiplexing circuit to account for sequential delay across the shared subset of the design.

18. The method of claim 17, wherein the sequential delay is added according to the formula (x MOD n), wherein x represents the sequential delay across the shared subset of the design and n represents the number of candidates for sharing folded onto the shared circuit resources.

19. The method of claim 18, further comprising identifying sequential elements within the shared subset of the design as one of pipeline sequential elements and state sequential elements.

20. The method of claim 19, further comprising n-plicating each state sequential element identified within the shared subset of the design, wherein n-plicating includes transforming each state sequential element into n logically pipelined sequential elements.

21. The method of claim 20, wherein the n logically pipelined sequential elements comprise a shift register with n stages.

22. The method of claim 20, further comprising:
identifying unrolled looping structures within the circuit and re-rolling them including:
if one or more of the candidates for sharing are within an unrolled looping structure, then
generating a rolled-back looping structure by sharing resources among the candidates for sharing using folding transformation, and
multiplexing between an input supplied to the unrolled looping structure and a feedback loop routed from the output of the shared subset of the design, wherein the feedback loop and the remaining inputs of multiplexing circuit are shorted together.

23. The method of claim 20, further comprising leveraging built-in features of the candidates for sharing including decoders, multiplexors, and busses to perform the time-multiplexing between operations of each of the candidates for sharing.

24. The method of claim 23, wherein if the candidates for sharing include existing memory structures, then performing the following:
identifying the existing memory structures within the candidates for sharing that include at least one unused address port; and
generating a shared memory structure resulting from sharing resources among each of the existing memory structures using a folding transformation including folding the existing memory structures onto a set of circuit resources common to each, and time-multiplexing between operations of each of the existing memory structures.

25. The method of claim 24, wherein the time-multiplexing is performed by leveraging built-in address decoders of the new memory structure, and wherein the at least one unused address port of the shared memory structure is used as a thread identifier to multiplex among the existing structures sharing the circuit resources of the shared memory structure.

26. The method of claim 25, further comprising:
optimizing existing memory structures in the integrated circuit including:
identifying compatible and incompatible memory structures in the design as candidates for sharing resources;
rebalancing I/O of incompatible memory structures to construct additional compatible memory structures in the design as candidates for sharing, the rebalancing including adding at least one additional address port to the incompatible memory structures and reducing a set of data ports of the existing memory structures by half, resulting in a rebalanced compatible memory structure with at least one unused address port and double an amount of addressable memory locations; and
generating a shared memory structure resulting from sharing resources among the compatible memory structures using folding transformation including folding the compatible memory structures onto a set of circuit resources common to each, and time-multiplexing between operations of each of the compatible memory structures.

27. The method of claim 26, wherein the time-multiplexing is performed by leveraging built-in address decoders of the shared memory structure, wherein the at least one unused address port of the shared memory structure is used as a thread identifier to multiplex among the compatible memory structures sharing resources.

28. The method of claim 23, wherein if the candidates for sharing are I/O clients coupled with a bi-directional I/O bus, then the bi-directional I/O bus performs the multiplexing.

29. The method of claim 20, further comprising evaluating results obtained from the folding transformation to determine whether to include each of the candidates in a final output of the modified circuit description, wherein each of the candidates for sharing is included in the final output of the modified circuit description if the results obtained from the resource sharing improve one or more of a set of parameters including actual resource utilization, cost, size, space, performance metrics, and energy and power consumption.

30. The method of claim 29, further comprising verifying the modified description of the circuit by performing one or more of the following:
examining results of a plurality of individual cases in which each resource of the modified circuit description is used for one or more purposes, and comparing results obtained from the examining to results obtained from applying the same plurality of individual cases to the original circuit design; and
unfolding the folded circuit to determine whether an original circuit configuration of the design is recovered.

31. The method of claim 1, wherein the candidates for sharing include one or more of a software routine, subset of a data flow graph, subset of a control flow graph, functional module, block of HDL code, body of a looping structure, and a subcircuit.

32. The method of claim 1, wherein the integrated circuit to be optimized is implemented as one or more of a Field-Programmable Gate Array (FPGA) or an Application-Specific Integrated Circuit (ASIC).

33. The method of claim 32, wherein the circuit is described at one or more levels of specification including high-level descriptions, mapped netlists, RTL-level, HDL-level, schematic level, circuit level, technology-independent gate level, technology-dependent gate layout level, and floorplan level.

34. A method to optimize an integrated circuit comprising:
receiving a description of a design of the integrated circuit;
identifying two or more subsets of the design having similar functionality, but with one or more different input/output (I/O) signals, as candidates for sharing;
generating a shared subset of the design resulting from sharing circuit resources among each of the candidates for sharing using a folding transformation, the folding transformation including folding the candidates for sharing onto a set of circuit resources common to each, and time-multiplexing among operations of each of the candidates for sharing;
decomposing one or more subsets of the design into smaller subsets; and
sharing circuit resources among each of the smaller subsets using a folding transformation including folding the smaller subsets onto a set of circuit resources common to each, and time-multiplexing between operations of each of the smaller subsets, wherein at least one of the receiving, identifying, generating, decomposing, and sharing is performed by a processor.

35. The method of claim 34, further comprising:
determining which of the smaller subsets can be operated at a higher clock-frequency;
performing the time-multiplexing of the smaller subsets at the higher clock-frequency in alternating micro-cycles delimited by cycles of a fast clock;
determining which of the smaller subsets include temporally-disjoint functions; and
performing the time-multiplexing of the smaller subsets with temporally-disjoint functions using one or multiple system clocks of the original circuit.

36. A non-transitory computer-readable storage medium that provides instruction, which when executed by a computer performs a method for optimizing an integrated circuit, the method comprising:
receiving a description of a design of the integrated circuit;
identifying two or more subsets of the design having similar functionality, but with one or more different input/output (I/O) signals, as candidates for sharing;
generating a shared subset of the design resulting from sharing circuit resources among each of the candidates for sharing using a folding transformation, the folding transformation including folding the candidates for sharing onto a set of circuit resources common to each, and time-multiplexing among operations of each of the candidates for sharing;
determining which of the candidates for sharing can be operated at a higher clock-frequency; and
performing the time-multiplexing of the candidates for sharing at the higher clock-frequency in alternating micro-cycles delimited by cycles of a fast clock.

37. The non-transitory computer-readable storage medium of claim 36, wherein the candidates for sharing include one or more of the following: candidates with identical functionality; candidates with similar functionality; a collection of connected candidates for sharing; a collection of candidates for sharing not all of which are connected; candidates for sharing with logic around them; candidates for sharing with functionality similar to a subset of other candidates for sharing; and candidates for sharing replaceable by a specially-designed super-module.

38. The non-transitory computer-readable storage medium of claim 37, further comprising:
determining which of the candidates for sharing include temporally-disjoint functions; and
performing the time-multiplexing of the candidates for sharing with temporally-disjoint functions using a clock derived from one or multiple system clocks of the original circuit.

39. The non-transitory computer-readable storage medium of claim 38, wherein the fast clock is faster than the speed of the one or multiple system clocks by up to a factor n, wherein n is equal to a number of candidates for sharing folded onto the shared circuit resources.

40. The non-transitory computer-readable storage medium of claim 39, wherein the time-multiplexing between operations of each of the candidates for sharing further comprises generating a multiplexing circuit to time-multiplex inputs corresponding to each of the candidates for sharing.

41. The non-transitory computer-readable storage medium of claim 40, wherein generating the multiplexing circuit comprises:
reconnecting inputs previously supplied to each of the candidates for sharing to inputs of a multiplexor; and
connecting an output of the multiplexor to an input of the shared subset of the design.

42. The non-transitory computer-readable storage medium of claim 41, wherein the time-multiplexing between operations of each of the candidates for sharing further comprises generating a demultiplexing circuit to time-demultiplex outputs received from the shared subset of the design.

43. The non-transitory computer-readable storage medium of claim 42, wherein generating the demultiplexing circuit comprises:
connecting an output of the shared subset of the design to an input of the demultiplexing circuit to receive the time-multiplexed outputs from the shared subset of the design; and reconnecting outputs previously supplied from each of the candidates for sharing to outputs of the demultiplexing circuit.

44. The non-transitory computer-readable storage medium of claim 43, further comprising:
    assigning threads to each of the candidates for sharing; and
    coordinating the time-multiplexed signals through the shared subset of the design based on the assigned threads.

45. The non-transitory computer-readable storage medium of claim 44, wherein the demultiplexing circuit is implemented as a demultiplexor to distribute the time-multiplexed output signals from the shared subset of the design to a set of receiving logic, wherein the demultiplexor includes select inputs to select among the receiving logic based on the assigned threads.

46. The non-transitory computer-readable storage medium of claim 45, wherein the assigning threads to each of the candidates for sharing and coordinating the time-multiplexed signals through the shared subset of the design based on the assigned threads is accomplished using a selection circuit to switch among threads by toggling select lines coupled with select inputs of the multiplexing circuit and to toggle select lines coupled with the select inputs of the demultiplexing circuit.

47. The non-transitory computer-readable storage medium of claim 46, further comprising adding a sequential delay of zero or more cycles to the select lines coupled with the select inputs of the demultiplexing circuit to account for sequential delay across the shared subset of the design.

48. The non-transitory computer-readable storage medium of claim 47, further comprising identifying sequential elements within the shared subset of the design as one of pipeline sequential elements and state sequential elements.

49. The non-transitory computer-readable storage medium of claim 48, further comprising n-plicating each state sequential element identified within the shared subset of the design, wherein n-plicating includes transforming each state sequential element into n logically pipelined sequential elements.

50. The non-transitory computer-readable storage medium of claim 49, further comprising:
    identifying unrolled looping structures within the circuit and re-rolling them including:
        if one or more of the candidates for sharing are within an unrolled looping structure, then
        generating a rolled-back looping structure by sharing resources among the candidates for sharing using folding transformation, and
        multiplexing between an input supplied to the unrolled looping structure and a feedback loop routed from the output of the shared subset of the design, wherein the feedback loop and the remaining inputs of multiplexing circuit are shorted together.

51. The non-transitory computer-readable storage medium of claim 49, further comprising leveraging built-in features of the candidates for sharing including decoders, multiplexors, and busses to perform the time-multiplexing between operations of each of the candidates for sharing.

52. The non-transitory computer-readable storage medium of claim 51, wherein if the candidates for sharing include existing memory structures, then performing the following:
    identifying the existing memory structures within the candidates for sharing that include at least one unused address port; and
    generating a shared memory structure resulting from sharing resources among each of the existing memory structures using a folding transformation including folding the existing memory structures onto a set of circuit resources common to each, and time-multiplexing between operations of each of the existing memory structures.

53. The non-transitory computer-readable storage medium of claim 51, further comprising:
    optimizing existing memory structures in the integrated circuit including:
        identifying compatible and incompatible memory structures in the design as candidates for sharing resources;
        rebalancing I/O of incompatible memory structures to construct additional compatible memory structures in the design as candidates for sharing, the rebalancing including adding at least one additional address port to the incompatible memory structures and reducing a set of data ports of the existing memory structures by half, resulting in a rebalanced compatible memory structure with at least one unused address port and double an amount of addressable memory locations; and
        generating a shared memory structure resulting from sharing resources among the compatible memory structures using folding transformation including folding the compatible memory structures onto a set of circuit resources common to each, and time-multiplexing between operations of each of the compatible memory structures.

54. The non-transitory computer-readable storage medium of claim 49, further comprising evaluating results obtained from the folding transformation to determine whether to include each of the candidates in a final output of the modified circuit description.

55. The non-transitory computer-readable storage medium of claim 54, further comprising verifying the modified description of the circuit by performing one or more of the following:
    examining results of a plurality of individual cases in which each resource of the modified circuit description is used for one or more purposes, and comparing results obtained from the examining to results obtained from applying the same plurality of individual cases to the original circuit design; and
    unfolding the folded circuit to determine whether an original circuit configuration of the design is recovered.

56. A non-transitory computer-readable storage medium that provides instruction, which when executed by a computer performs a method for optimizing an integrated circuit, the method comprising:
    receiving a description of a design of the integrated circuit;
    identifying two or more subsets of the design having similar functionality, but with one or more different input/output (I/O) signals, as candidates for sharing;
    generating a shared subset of the design resulting from sharing circuit resources among each of the candidates for sharing using a folding transformation, the folding transformation including folding the candidates for sharing onto a set of circuit resources common to each, and time-multiplexing among operations of each of the candidates for sharing;
    decomposing one or more subsets of the design into smaller subsets; and
    sharing circuit resources among each of the smaller subsets using a folding transformation including folding the smaller subsets onto a set of circuit resources common to each, and time-multiplexing between operations of each of the smaller subsets.

57. The non-transitory computer-readable storage medium of claim 56, further comprising:
 determining which of the smaller subsets can be operated at a higher clock-frequency;
 performing the time-multiplexing of the smaller subsets at the higher clock-frequency in alternating micro-cycles delimited by cycles of a fast clock;
 determining which of the smaller subsets include temporally-disjoint functions; and
 performing the time-multiplexing of the smaller subsets with temporally-disjoint functions using one or multiple system clocks of the original circuit.

58. A data processing system to optimize an integrated circuit comprising:
 a processor, and a memory coupled to the processor, wherein the processor is configured to receive a description of a design of the integrated circuit; the processor is configured to identify two or more subsets of the design having similar functionality, but with one or more different input/output (I/O) signals, as candidates for sharing; the processor is configured to generate a shared subset of the design resulting from sharing circuit resources among each of the candidates for sharing using a folding transformation, the folding transformation including folding the candidates for sharing onto a set of circuit resources common to each, and time-multiplexing among operations of each of the candidates for sharing; the processor is configured to determine which of the candidates for sharing can be operated at a higher clock-frequency; and the processor is configured to perform the time-multiplexing of the candidates for sharing at the higher clock-frequency in alternating micro-cycles delimited by cycles of a fast clock.

59. The data processing system of claim 58, wherein the candidates for sharing include one or more of the following: candidates with identical functionality; candidates with similar functionality; a collection of connected candidates for sharing; a collection of candidates for sharing not all of which are connected; candidates for sharing with logic around them; candidates for sharing with functionality similar to a subset of other candidates for sharing; and candidates for sharing replaceable by a specially-designed super-module.

60. The data processing system of claim 58, wherein the processor is further configured to determine which of the candidates for sharing include temporally-disjoint functions; and the processor is further configured to perform the time-multiplexing of the candidates for sharing with temporally-disjoint functions using a clock derived from one or multiple system clocks of the original circuit.

61. The data processing system of claim 58, wherein the candidates for sharing include one or more of a software routine, subset of a data flow graph, subset of a control flow graph, functional module, block of HDL code, body of a looping structure, and a subcircuit.

62. The data processing system of claim 58, wherein the integrated circuit to be optimized is implemented as one or more of a Field-Programmable Gate Array (FPGA) or an Application-Specific Integrated Circuit (ASIC).

63. A data processing system to optimize an integrated circuit comprising:
 a memory; and a processor coupled to the memory, wherein the processor is configured to receive a description of a design of the integrated circuit; the processor is configured to identify two or more subsets of the design having similar functionality, but with one or more different input/output (I/O) signals, as candidates for sharing; the processor is configured to generate a shared subset of the design resulting from sharing circuit resources among each of the candidates for sharing using a folding transformation, the folding transformation including folding the candidates for sharing onto a set of circuit resources common to each, and time-multiplexing among operations of each of the candidates for sharing; the processor is configured to decompose one or more subsets of the design into smaller subsets; the processor is configured to share circuit resources among each of the smaller subsets using a folding transformation including folding the smaller subsets onto a set of circuit resources common to each, and the processor is configured to time-multiplex between operations of each of the smaller subsets.

64. The data processing system of claim 63, wherein the processor is further configured to determine which of the smaller subsets can be operated at a higher clock-frequency; the processor is further configured to perform the time-multiplexing of the smaller subsets at the higher clock-frequency in alternating micro-cycles delimited by cycles of a fast clock; the processor is further configured to determine which of the smaller subsets include temporally-disjoint functions; and the processor is further configured to perform the time-multiplexing of the smaller subsets with temporally-disjoint functions using one or multiple system clocks of the original circuit.

* * * * *